(12) United States Patent
Wallinger

(10) Patent No.: US 10,583,940 B2
(45) Date of Patent: Mar. 10, 2020

(54) PRESSURIZED PAYLOAD COMPARTMENT AND MISSION AGNOSTIC SPACE VEHICLE INCLUDING THE SAME

(71) Applicant: York Space Systems LLC, Denver, CO (US)

(72) Inventor: Dirk Wallinger, Denver, CO (US)

(73) Assignee: YORK SPACE SYSTEMS LLC, Denver, CO (US)

(*) Notice: Subject to any disclaimer, the term of this patent is extended or adjusted under 35 U.S.C. 154(b) by 934 days.

(21) Appl. No.: 15/059,411

(22) Filed: Mar. 3, 2016

(65) Prior Publication Data

US 2016/0257433 A1 Sep. 8, 2016

Related U.S. Application Data

(60) Provisional application No. 62/127,359, filed on Mar. 3, 2015.

(51) Int. Cl.
*B64G 1/66* (2006.01)
*B64G 1/10* (2006.01)
(Continued)

(52) U.S. Cl.
CPC .......... *B64G 1/66* (2013.01); *B64G 1/10* (2013.01); *B64G 1/50* (2013.01); *B64G 1/503* (2013.01);
(Continued)

(58) Field of Classification Search
CPC . B64G 1/66; B64G 1/50; B64G 1/503; B64G 2001/228; F28D 2021/0021;
(Continued)

(56) References Cited

U.S. PATENT DOCUMENTS 3,565,671 A * 2/1971 Teeg .................. B64G 1/50
428/332
3,596,711 A * 8/1971 Rothert .............. H05K 7/20218
165/104.33
(Continued)

FOREIGN PATENT DOCUMENTS

WO WO-03106264 A1 12/2003

OTHER PUBLICATIONS

Spores, Ronald, et al. "A solar electric propulsion cargo vehicle to support NASA lunar exploration program." IEPC Paper No. IEPC-2005-320, 25th International Electric Propulsion Conference, Princeton, NJ, October. vol. 31. 2005. (Year: 2005).*

*Primary Examiner* — Philip J Bonzell
(74) *Attorney, Agent, or Firm* — Drinker Biddle & Reath LLP

(57) ABSTRACT

A compartment for a space vehicle includes a pressurized structure having a structural wall, the structural wall having interior surfaces facing an interior of the compartment and exterior surfaces exposed to an external environment. An internal mounting structure for mounting a component is provided within the compartment, and mounting features support the internal mounting structure from the pressurized structure. The internal mounting structure is spaced away from the interior surfaces of the pressurized structure, and a thermal fluid is provided in the pressurized structure. The thermal fluid enables convective heat transfer between the component mounted on the internal mounting structure and the interior surfaces of the pressurized structure.

17 Claims, 22 Drawing Sheets

(51) Int. Cl.
*H05K 7/20* (2006.01)
*B64G 1/50* (2006.01)
B64G 1/22 (2006.01)
B64G 1/64 (2006.01)
B64G 1/00 (2006.01)

(52) U.S. Cl.
CPC ......... *H05K 7/203* (2013.01); *H05K 7/20218* (2013.01); *H05K 7/20245* (2013.01); *B64G 1/002* (2013.01); *B64G 1/641* (2013.01); *B64G 2001/228* (2013.01)

(58) Field of Classification Search
CPC .. F28D 2021/0028; F28D 1/02; F28D 1/0226; H05K 7/20218; H05K 7/20245; H05K 7/203; H01L 23/46; H01L 23/467; H01L 23/473
See application file for complete search history.

(56) References Cited

U.S. PATENT DOCUMENTS

| | | | |
|---|---|---|---|
| 3,603,530 A | 9/1971 | Easton et al. | |
| 4,057,104 A | 11/1977 | Altoz | |
| 4,133,376 A | 1/1979 | Eilenberg et al. | |
| 4,384,692 A | 5/1983 | Preukschat | |
| 4,420,035 A | 12/1983 | Hewitt | |
| 4,504,030 A | 3/1985 | Kniat et al. | |
| 4,562,979 A * | 1/1986 | Taylor | B64G 9/00 220/8 |
| 4,590,538 A * | 5/1986 | Cray, Jr. | H05K 7/20236 361/700 |
| 4,795,113 A | 1/1989 | Minovitch | |
| 4,880,187 A | 11/1989 | Rourke et al. | |
| 5,152,482 A | 10/1992 | Perkins et al. | |
| 5,161,610 A * | 11/1992 | Leidinger | B64G 1/50 122/40 |
| 5,203,844 A | 4/1993 | Leonard | |
| 5,271,582 A | 12/1993 | Perkins et al. | |
| 5,305,184 A * | 4/1994 | Andresen | H01L 23/44 165/104.33 |
| 5,314,146 A | 5/1994 | Chicoine et al. | |
| 5,372,183 A | 12/1994 | Strickberger | |
| 5,441,221 A | 8/1995 | Wade et al. | |
| 5,518,209 A | 5/1996 | Chicoine et al. | |
| 5,589,274 A * | 12/1996 | Long | B64G 1/226 428/213 |
| 5,603,892 A | 2/1997 | Grilletto et al. | |
| 5,806,800 A | 9/1998 | Caplin | |
| 5,839,696 A | 11/1998 | Caplin et al. | |
| 5,897,080 A | 4/1999 | Barrett | |
| 5,931,418 A | 8/1999 | Eller et al. | |
| 5,954,298 A | 9/1999 | Basuthakur et al. | |
| 5,984,235 A | 11/1999 | Snowhook | |
| 6,003,817 A | 12/1999 | Basuthakur et al. | |
| 6,016,999 A | 1/2000 | Simpson et al. | |
| 6,019,167 A * | 2/2000 | Bishop | F28F 1/10 165/104.19 |
| 6,073,887 A | 6/2000 | Hosick | |
| 6,073,888 A | 6/2000 | Gelon et al. | |
| 6,080,962 A | 6/2000 | Lee | |
| 6,206,327 B1 | 3/2001 | Benedetti et al. | |
| 6,213,327 B1 | 4/2001 | Zengerle | |
| 6,284,966 B1 | 9/2001 | Simburger et al. | |
| 6,298,289 B1 | 10/2001 | Lloyd et al. | |
| 6,318,674 B1 | 11/2001 | Simburger | |
| 6,481,670 B1 | 11/2002 | Bigelow et al. | |
| 6,550,720 B2 | 4/2003 | Fleeter et al. | |
| 6,561,461 B2 | 5/2003 | Goldstein et al. | |
| 6,789,767 B2 | 9/2004 | Mueller et al. | |
| 6,921,051 B2 | 7/2005 | Lopata et al. | |
| 6,923,249 B1 | 8/2005 | Porter et al. | |
| 6,945,498 B2 | 9/2005 | Mueller et al. | |
| 7,036,773 B2 | 5/2006 | Caldwell | |
| 7,131,484 B2 | 11/2006 | Gayrard et al. | |
| 7,163,179 B1 | 1/2007 | Taylor | |
| 7,307,841 B2 * | 12/2007 | Berlin | H01L 23/44 165/80.4 |
| 7,354,020 B2 | 4/2008 | Mueller et al. | |
| 7,513,462 B1 | 4/2009 | McKinnon et al. | |
| 7,724,524 B1 * | 5/2010 | Campbell | H05K 7/20772 165/104.19 |
| 7,762,499 B1 | 7/2010 | Hentosh et al. | |
| 7,866,607 B2 | 1/2011 | Benedict | |
| 7,874,520 B2 | 1/2011 | McKinnon et al. | |
| 7,905,453 B2 | 3/2011 | Benedict et al. | |
| 7,931,237 B2 | 4/2011 | Penzo | |
| 8,096,512 B2 | 1/2012 | Russell | |
| 8,342,454 B1 | 1/2013 | Leimkuehler et al. | |
| 8,393,582 B1 | 3/2013 | Kutter et al. | |
| 8,789,797 B2 | 7/2014 | Darooka | |
| 8,804,228 B1 | 8/2014 | Biffle et al. | |
| 9,167,720 B2 * | 10/2015 | Uluc | H05K 7/20681 |
| 9,258,926 B2 * | 2/2016 | Smith | H05K 7/20818 |
| 9,408,332 B2 * | 8/2016 | Smith | H05K 7/20836 |
| 9,560,789 B2 * | 1/2017 | Smith | H05K 5/0017 |
| 9,655,279 B2 * | 5/2017 | Pelletier | G06F 1/206 |
| 9,699,939 B2 * | 7/2017 | Smith | G06F 1/20 |
| 10,045,467 B2 * | 8/2018 | Smith | G06F 1/20 |
| 2003/0010041 A1 * | 1/2003 | Wessling | B64G 1/50 62/60 |
| 2007/0063105 A1 | 3/2007 | Mann | |
| 2007/0171614 A1 * | 7/2007 | Pedoeem | H04L 12/18 361/695 |
| 2008/0149776 A1 | 6/2008 | Benedict | |
| 2008/0217483 A1 | 9/2008 | Hugon et al. | |
| 2008/0289801 A1 | 11/2008 | Batty et al. | |
| 2009/0050745 A1 | 2/2009 | Mueller et al. | |
| 2009/0127399 A1 | 5/2009 | Mueller et al. | |
| 2009/0196986 A1 * | 8/2009 | Cordaro | B64G 1/226 427/126.4 |
| 2010/0218496 A1 | 9/2010 | Miles | |
| 2010/0223942 A1 | 9/2010 | Merino et al. | |
| 2010/0243817 A1 | 9/2010 | McKinnon et al. | |
| 2010/0254087 A1 * | 10/2010 | Godfroy | H05K 5/06 361/699 |
| 2011/0001013 A1 | 1/2011 | Torres Sepulveda et al. | |
| 2012/0043427 A1 | 2/2012 | Flemin et al. | |
| 2012/0091281 A1 | 4/2012 | Kutter et al. | |
| 2014/0131521 A1 | 5/2014 | Apland et al. | |
| 2014/0291452 A1 * | 10/2014 | Martinez | F16F 9/526 244/173.2 |
| 2014/0305425 A1 | 10/2014 | Prutsman et al. | |
| 2015/0000319 A1 * | 1/2015 | Smith | H05K 7/20218 62/260 |
| 2015/0367964 A1 * | 12/2015 | Judd | B64G 1/10 244/158.1 |
| 2015/0373882 A1 * | 12/2015 | Smith | H05K 7/20818 361/679.46 |
| 2015/0382515 A1 * | 12/2015 | James | H05K 7/20818 361/679.47 |
| 2016/0088767 A1 * | 3/2016 | Kolstad | E21B 41/0007 361/699 |
| 2016/0143191 A1 * | 5/2016 | Smith | H05K 7/20836 361/679.46 |
| 2016/0329113 A1 * | 11/2016 | El-Genk | G21C 15/12 |
| 2016/0345461 A1 * | 11/2016 | Smith | H05K 5/0017 |
| 2017/0127556 A1 * | 5/2017 | Smith | G06F 1/20 |
| 2017/0303442 A1 * | 10/2017 | Smith | H05K 7/20809 |

* cited by examiner

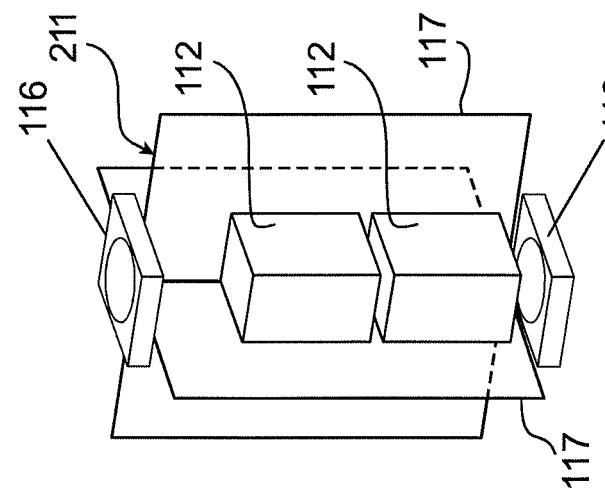
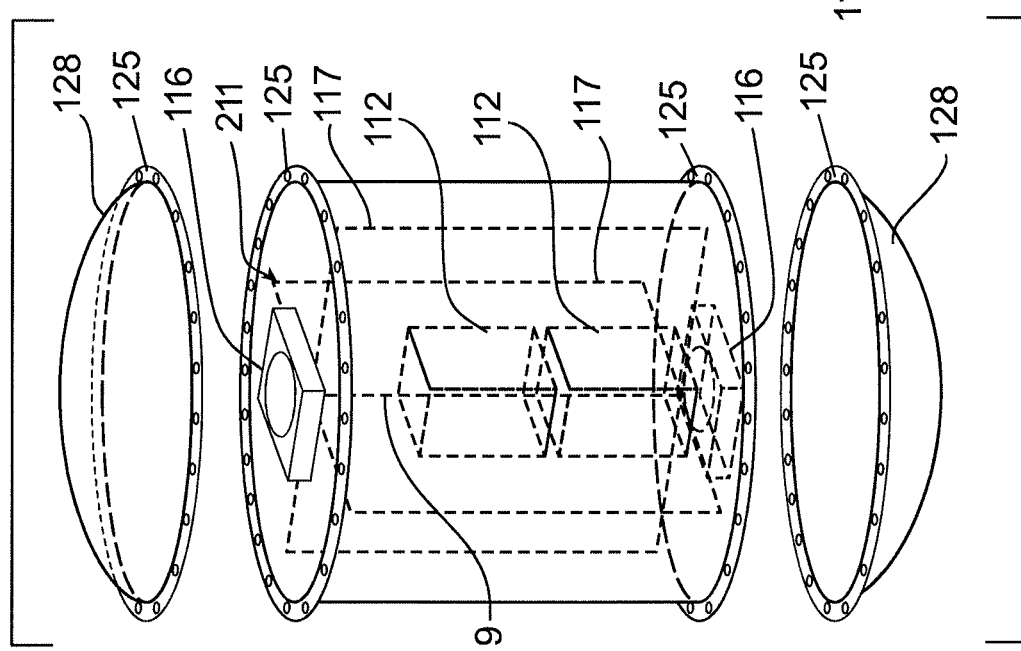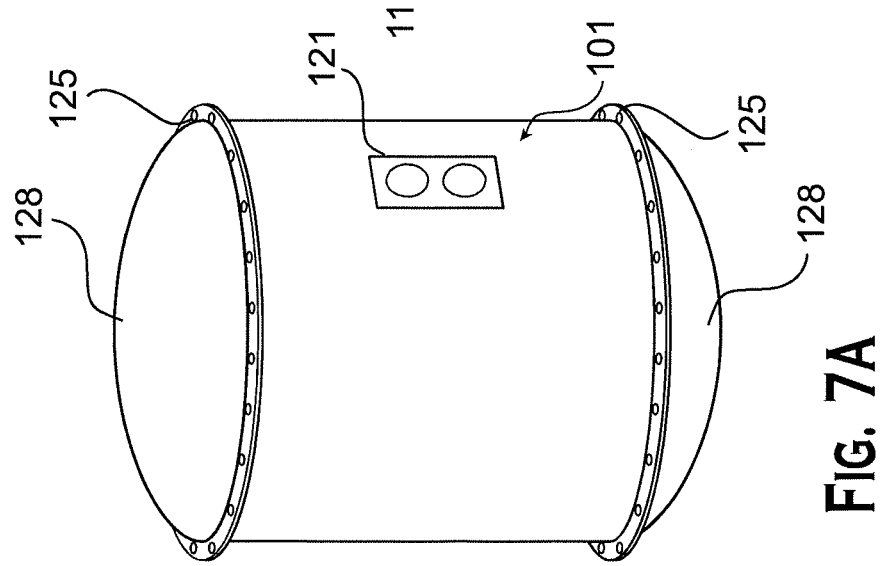

Payload Load Path
— — — —

Bus Load Path
• • • • • • • •

PRESSURIZED PAYLOAD COMPARTMENT AND MISSION AGNOSTIC SPACE VEHICLE INCLUDING THE SAME

This application claims priority under 35 U.S.C. § 119 to U.S. Provisional Patent Application No. 62/127,359, filed on Mar. 3, 2015, which is incorporated by reference herein in its entirety.

FIELD OF THE INVENTION

The present invention relates generally to mission agnostic space vehicles.

BACKGROUND OF THE INVENTION

Today, over 1,100 functioning satellites orbit our Earth in addition to approximately 2,600 decommissioned satellites. These currently functioning space vehicles provide a wide range of services including Global Positioning System (GPS) navigation aid, telephone communications, television broadcast, weather forecasting, and defense-oriented purposes. Space vehicle technology generally has provided widely used and useful technology, but remains prohibitively expensive to develop, design, and construct a space vehicle for any purpose.

A space vehicle, as used herein, may include various configurations. For instance, a space vehicle may consist of a spacecraft bus alone. In addition, a space vehicle may include the spacecraft bus and a payload, which itself may have different configurations. The payload may be in a non-pressurized, a partially pressurized, or a fully pressurized configuration. In this regard, the payload could include an apparatus chosen based upon the particular mission and electronic components associated with the apparatus. Pressurization of the payload could be applied on the basis of a subset of components of the payload or to the payload as a whole.

Current space vehicle specifications require that space vehicles and components be designed to withstand hostile vibration and shock launch environments, very large operational temperature ranges (e.g., −30 to 150° F./−34 to 66° C.), and vacuum pressure environments. Furthermore, developers typically develop space vehicle technologies optimized specifically for a single mission, requiring significant lead time. An associated challenge, therefore, is that the same design cannot typically be re-used in association with dissimilar mission profiles. Each space vehicle is a custom built unique piece of hardware, with the associated high costs and applicability of use associated with such specialization. Environmental considerations and single-mission profile platforms remain primary drivers for the prohibitive cost of unmanned space vehicles and associated components.

It will be appreciated to those skilled in the art that a vacuum environment, as used herein, refers to the atmospheric environmental conditions as found in the operating envelope of space vehicles as deployed in orbit around the earth or beyond dependent upon mission profile.

A recurring challenge associated with space vehicles relates to thermal management, which plays a major role in the design of space vehicles. This derives from nuances associated with space vehicle component electronic equipment, which has finite environmental limitations particularly associated with temperature range and vacuum environment. This challenge relates to the lack of atmosphere in the operating range of satellites and other space vehicles. Thus, the temperature profile swings drastically based on solar exposure.

A surface of a space vehicle exposed to the sun's radiation receives about 1400 W/m². As a result, a space vehicle may experience a surface temperature exceeding allowable operational temperatures of component electronic equipment. In operation, the surface temperature of a space vehicle may reach as high as 250° F. or higher.

Furthermore, a surface of a space vehicle not exposed to solar radiation results in a surface temperature well below desirable operational temperatures of components. The surface temperature in this scenario may reach as low as −29° C. (−22° F.) or lower. Both hot and cold temperatures in these scenarios introduce expensive design criteria for the manufacturer.

A problem with some space vehicles is that components are mounted directly to externally facing panels. Thus, such panels experience potentially damaging operational temperature swings based on situational orientation in relation to solar radiation. Many components involve critical electronics that are temperature sensitive electronics, which cannot operate within the broad range of environmentally driven operational temperatures and pressures experienced by a space vehicle, such as those associated with designing for a vacuum, such as outgassing, material tracking contamination migration, corona effects in a low vacuum, etc., without significant design costs associated with mitigation of the operational temperatures and pressures.

It will be appreciated by those skilled in the art that such problems surrounding operational pressures include outgassing of components, material tracking, contamination migration, and corona effects in low vacuum comprise some of the many problems associated with operating in a vacuum environment with electrically powered equipment.

Some space vehicle technologies attempt to solve the problem of operational temperature ranges inherent in space vehicle operating environments through an active thermal radiation system to reject excess heat witnessed by a sun-facing surface of the space vehicle to a shaded surface of the space vehicle. The problems associated with such systems include problems associated with cost, complexity, weight, and reliability. Such systems are expensive to implement. They may occupy critical weight and volume that could otherwise be utilized by additional components and/or payload systems. In order to provide functionality to such systems, dedicated batteries are employed and typically use a significant portion of available space, power, and weight capacities. The failure of such systems results in malfunction or failure of on-board systems, providing an additional point of failure and decreasing overall reliability and life span of the space vehicle.

Other space vehicle technologies employ a thermal working fluid in directed pipes conductively attached to all dissipating components and radiators. An inert gas within a pressurized pipe selectively directs the flow of the working fluid when released from pressurized storage tanks to radiators and dissipating components. Although such a system allows for the removal of batteries from usable payload space, such a system also involves compressors, control valves, and working fluid routing systems. This is problematic, as such systems add weight, numerous failure mechanisms, and cost to the build of the space vehicle. Thus, such systems limit the functional payload capacity that can be integrated within a given space vehicle structure. Furthermore, considerable engineering costs must be expended in order to evaluate and reduce failure modes, not including the need to tailor each platform to the specific mission of each space vehicle build.

With an ever-growing use of communications enabled devices, particularly those reliant on space vehicles and associated platforms, it becomes more critical to enable a cost-efficient and time-expedient solution in the deployment of such platforms. Given the discussion of aforementioned problems associated with space vehicles, the development and deployment of associated space vehicle technology based platforms remains cost prohibitive, heavy in nature, and/or have time intensive lead-time associated with it.

SUMMARY OF THE INVENTION

In an embodiment, the invention provides a compartment for a space vehicle, including a pressurized structure having a structural wall, the structural wall having interior surfaces facing an interior of the payload compartment and exterior surfaces exposed to an external environment; an internal mounting structure for mounting a component within the compartment; and mounting features supporting the internal mounting structure from the pressurized structure, wherein the internal mounting structure is spaced away from the interior surfaces of the pressurized structure, and wherein a thermal fluid is provided in the pressurized structure, the thermal fluid enabling convective heat transfer between the component mounted on the internal mounting structure and the interior surfaces of the pressurized structure.

In another embodiment, the invention provides a payload compartment for a space vehicle, including a pressurized structure having a structural wall, the structural wall having interior surfaces facing an interior of the payload compartment and exterior surfaces exposed to an external environment; a payload electronic component provided within the payload compartment; and mounting features supporting the payload electronic component from the pressurized structure, wherein the payload electronic component is spaced away from the interior surfaces of the pressurized structure, and wherein a thermal fluid is provided in the pressurized structure, the thermal fluid enabling convective heat transfer between the payload electronic component and the interior surfaces of the pressurized structure.

In another embodiment, the invention provides a space vehicle including a spacecraft bus, the spacecraft bus including a first pressurized structure having a first structural wall, the first structural wall having first interior surfaces facing a first interior of the spacecraft bus and first exterior surfaces exposed to an external environment; a first internal mounting structure for mounting a bus component within the spacecraft bus, the first internal mounting structure spaced away from the first interior surfaces of the first pressurized structure; and first mounting features supporting the first internal mounting structure from the first pressurized structure. The space vehicle further includes a payload compartment coupled to the spacecraft bus, the payload compartment including a second pressurized structure having a structural wall, the structural wall having interior surfaces facing an interior of the payload compartment and exterior surfaces exposed to an external environment; a payload electronic component provided within the payload compartment, the payload electronic component spaced away from the interior surfaces of the second pressurized structure; and second mounting features supporting the payload electronic component from the second pressurized structure, wherein a first thermal fluid is provided in the first pressurized structure, the first thermal fluid enabling convective heat transfer between the bus component and the first interior surfaces of the first pressurized structure, and wherein a second thermal fluid is provided in the second pressurized structure, the second thermal fluid enabling convective heat transfer between the payload electronic component and the second interior surfaces of the second pressurized structure.

Aspects of embodiments of the present invention include systems, apparatuses and methods associated with the construction configuration and use of a space vehicle to reduce cost per unit and increase payload capacity. Certain embodiments of the present invention incorporate novel configuration and thermal management strategies to provide a mission-agnostic space vehicle platform.

Embodiments of the invention include, but are not limited to, central mounting configurations, launch vibration isolation, easily customizable emissivity through the use of surface coatings, pressurized component enclosure, working fluids within a pressurized component enclosure, and fans driving a semi-passive convective thermal management system.

BRIEF DESCRIPTION OF THE DRAWINGS

The accompanying drawings, which are incorporated herein and constitute part of this specification, illustrate the presently preferred embodiments of the invention, and together with the general description given above and the detailed description given below, serve to explain features of the invention.

FIG. 7A is a perspective view of an embodiment of the invention;

FIG. 7B is an exploded transparent view of the embodiment shown in FIG. 7A;

FIG. 7C is a perspective view of an internal mounting structure and associated internally mounted components of the embodiment shown in FIG. 7B;

DETAILED DESCRIPTION OF THE PREFERRED EMBODIMENTS

Figure 1:
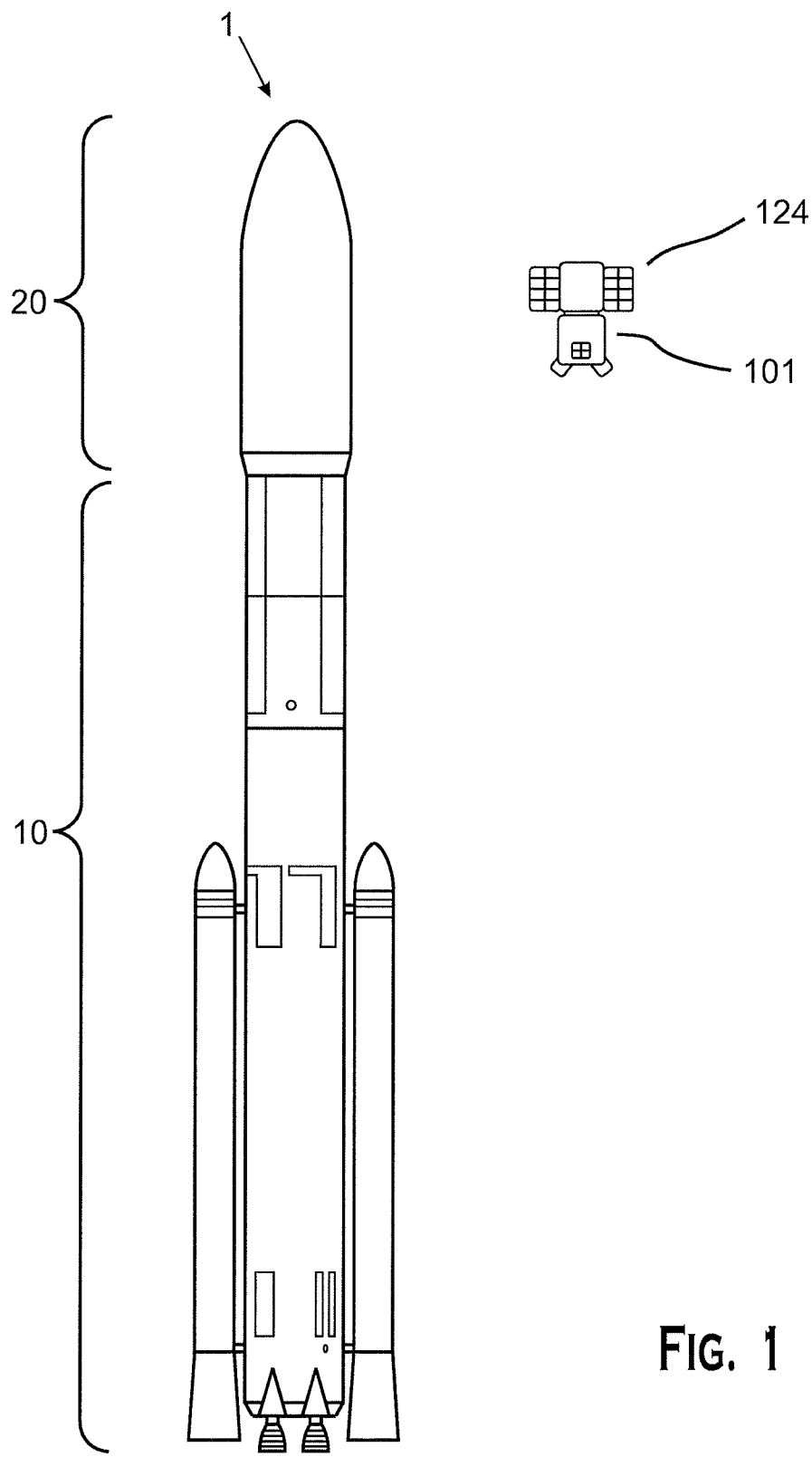
FIG. 1 is a representation of a spacecraft.

Aspects of the invention address one or more problems associated with the manufacture of space vehicles. The embodiments of the invention disclosed herein are typically associated with space vehicles bound for earth orbit, often in the form of what are referred to as "Satellites." A certain embodiment of the invention comprises a mission-agnostic space vehicle platform intended to reduce costs associated with the use of such space vehicles. With reference to FIG. 1, a rocket 1 can be comprised of two segments: a launch segment 10 and a space segment 20. After the launch of the rocket 1, the launch segment 10 can be discarded while the space segment 20 continues on to its designated mission. The space segment 20 further comprises a spacecraft bus 101 and a payload 124. The spacecraft bus 101 includes many of the electronic components that will be required during a mission, and will often include components that are commonly required across a variety of missions. The payload 124 includes mission-specific hardware mounted to the spacecraft bus 101. A space vehicle may include the spacecraft bus 101 alone or may include both the spacecraft bus 101 and the payload 124.

It will be appreciated by those skilled in the art that the term "mission agnostic," as used herein, refers to a space vehicle construct capable of accepting and supporting a plurality of different payloads, space vehicle components, mission configurations, and is capable of operating in numerous orbits and orientations without redesign.

It will be appreciated by those skilled in the art that the term "payload," refers to hardware mounted to the spacecraft bus 101 needed to serve specific tasks associated directly with accomplishing a particular mission. Examples of payloads include, but are not limited to, visible telescopes, infrared telescopes, synthetic aperture radars, communication antennas, hyperspectral sensors, gamma-ray sensors, weather instruments, robotics and satellite servicing mechanisms, and signal intelligence equipment.

It will be appreciated by those skilled in the art that the term "component," refers to hardware mounted to the space vehicle needed to perform basic space vehicle functions that are not necessarily unique to a specific mission. Examples of components that a space vehicle may require include, but are not limited to, command and data handling unit, power control and distribution unit, batteries, transmitters, receivers, encryptors, reaction wheels, pressurized supplemental thermal working fluid, control momentum gyroscopes (CMG), GPS receiver, star tracker electronics, torque rods, magnetometer, and inertial reference units. Furthermore, such components may be affixed to the space vehicle platform as an internally contained component or an externally mounted component.

Figure 2:
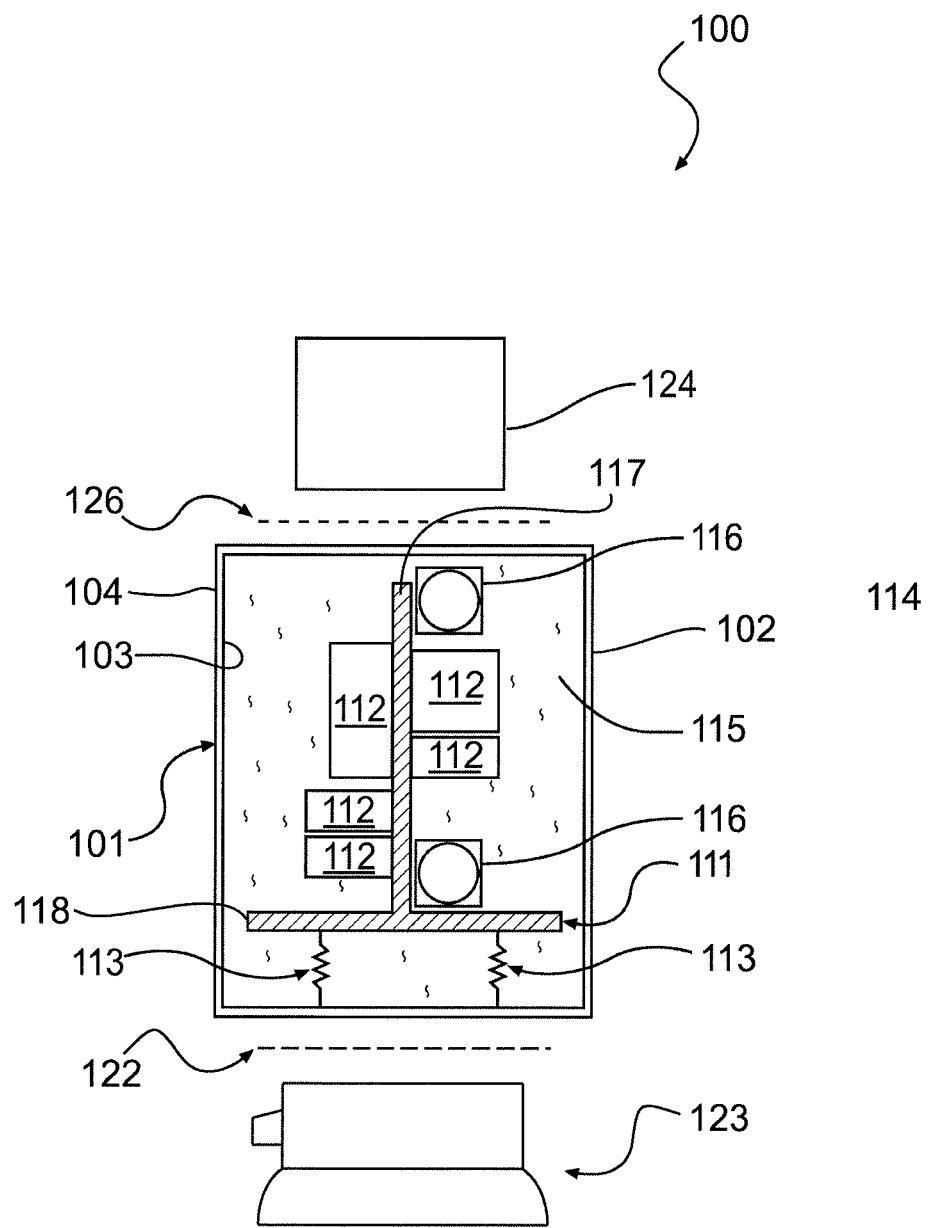
FIG. 2 is a section view of an embodiment of the invention.

The problem of payloads and components experiencing extreme or unfavorable temperatures and/or temperature ranges, launch loads, and vacuum environments is solved by an embodiment of the invention comprising a space vehicle 100 as further described herein. FIG. 2 demonstrates the external structure of the space vehicle 100 providing a spacecraft bus having a pressurized compartment 101 with an internal mounting structure 111 mechanically and thermally isolated from the main external structure 102 of the space vehicle 100. The pressurized compartment 101 is pressurized with a thermal working fluid 115, which is driven into a forced convective thermal management using thermal working fluid circulation mechanisms 116 (e.g., a fan). An exemplary embodiment also uses mounting of external payload 124 and instruments and interface 122 with a launch vehicle 123. The internal mounting structure 111 is not in direct contact with the interior surfaces 103 of the structural walls 102 of the pressurized structure 101. Pressurized structure 101 includes exterior-facing surfaces 104 exposed to the surrounding external environment 114. In an embodiment, the internal mounting structure 111 is substantially central to the pressurized structure 101. Also seen in FIG. 2 are components 112, mounting features 113, thermal working fluid 115, circulation devices 116, launch load interface 122, launch load source 123, external payloads 124, and external mounting surface 126, further described below.

Figure 5:
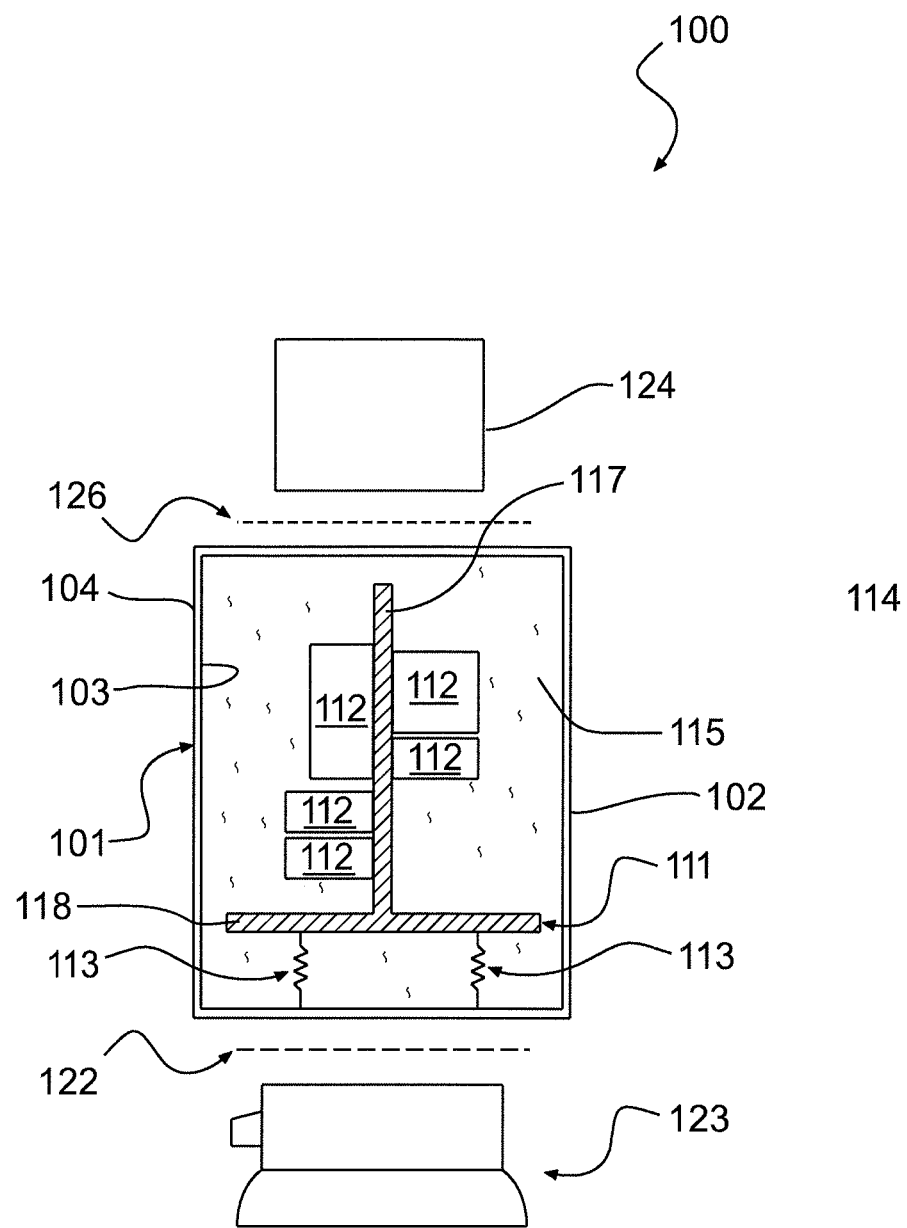
FIG. 5 is a section view of an embodiment of the invention.

According to an embodiment of the invention, FIG. 5 demonstrates a centrally mounted internal mounting structure 111 and affixed internal components 112 as thermally and mechanically isolated from walls 102 of the pressurized structure 101. A thermal working fluid 115 provides bulk thermal transfer between the pressurized structure 101 and internal components 112. The pressurized structure 101 functions as a pressurized component compartment by virtue of the thermal working fluid 115. The internal mounting structure 111 is constrained within the pressurized structure 101 to limit vertical, transverse, and rotational movement of the structure 111 and components 112 mounted thereon relative to the pressurized structure 101.

The component mounting structure 111 preferably exhibits a series of mounting points along at least one vertical axis or plane. The internal mounting structure 111 is connected to at least one mounting feature 113, and preferably a plurality of mounting features 113, to constrain the internal mounting structure 111. In an embodiment, the mounting structure 111 utilizes four points of constraint located radially and equidistant to the central axis of the pressurized structure 101 to limit vertical, transverse, and rotational motion of the mounting structure 111 and attached components 112. In an exemplary embodiment, the mounting features 113 attached to the internal mounting structure 111 utilize apparatus to thermally and mechanically isolate the internal mounting structure 111 and attached components 112 from extreme surface temperatures of the structural walls 102 which result from the external environment 114, and vibration inherent to the launch load interface 122, resulting from the launch load source 123. Loads associated with launch may include, for example, random vibration, shock, and acoustic loads. Mounting features 113 as used in certain embodiments are commonly referred to as "Multi-Plane Mounts," by those skilled in the art. The Multi-Plane Mounts provide thermal isolation as well as mechanical isolation from loads associated with the mission profile and operation of space vehicles 100. Also seen in FIG. 5 are external payloads 124 and external payload mounting surface 126.

With reference to FIG. 2, in an embodiment of the invention, the internal mounting structure 111 comprises at least one mounting panel 117, which may be of planar form, parallel to the central axis of the pressurized structure 101 and orthogonal to at least one exterior facing structural wall 102. The mounting panel 117 may be mounted to a base panel 118, which may also be of planar form, provided within the pressurized structure 101 at an angle to the mounting panel 117. The base panel 118 may be mounted to the pressurized structure 101 by way of mounting features 113. Optionally, mounting panel 117 may also be mounted to the pressurized structure 101 by way of additional mounting features 113.

Figure 4:
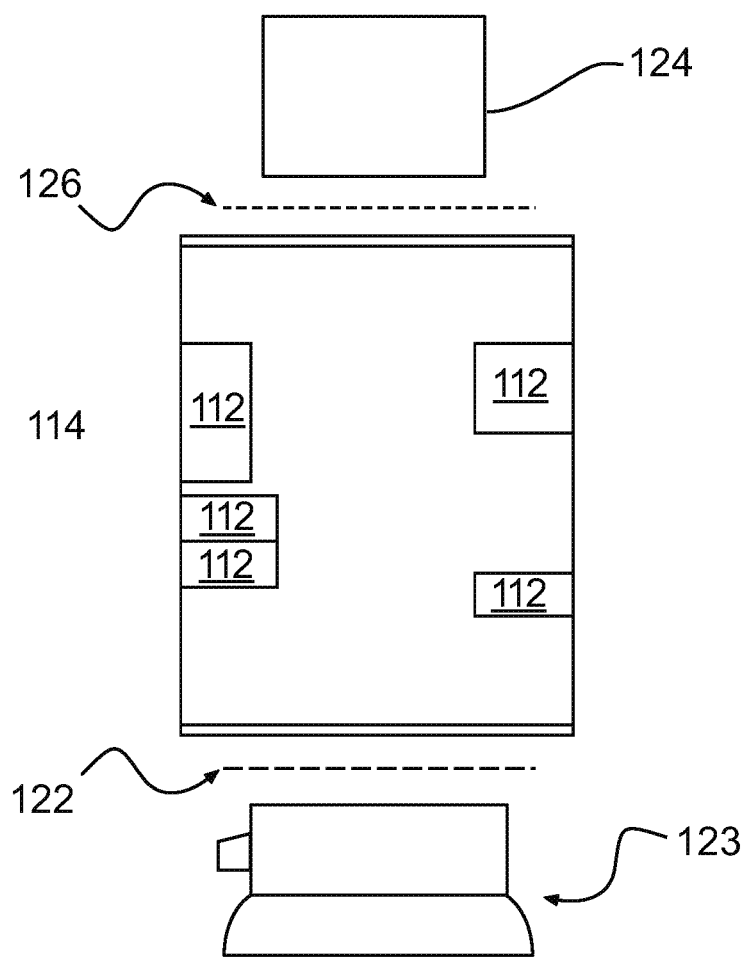
FIG. 4 is a section view of a prior art apparatus.

In certain embodiments of the invention, the thermal working fluid 115 is typically in a gaseous state and at least one thermal fluid circulating device 116 forces circulation of the thermal working fluid 115. While the thermal working fluid 115 is typically in gaseous state, the thermal working fluid 115 could alternatively be in liquid state. The circulating device 116 provides induced and/or directed convective thermal transfer between the components 112 and the thermal working fluid 115. Such circulating devices 116 may comprise a mechanism to drive airflow, such as a fan, blower, or other similar apparatus. By using an internal mounting structure 111, the present invention solves the problem of internally mounted components 112 being exposed to extreme temperature ranges as in the prior art (e.g., as seen in FIG. 4), which are typically fastened to surfaces of externally facing structural walls, exposing sensitive components to large and potentially damaging temperature variations, vacuum, and loads. In contrast, the thermal management strategy according to embodiments involves a bulk heat exchange strategy using the thermal working fluid 115.

Figure 3:
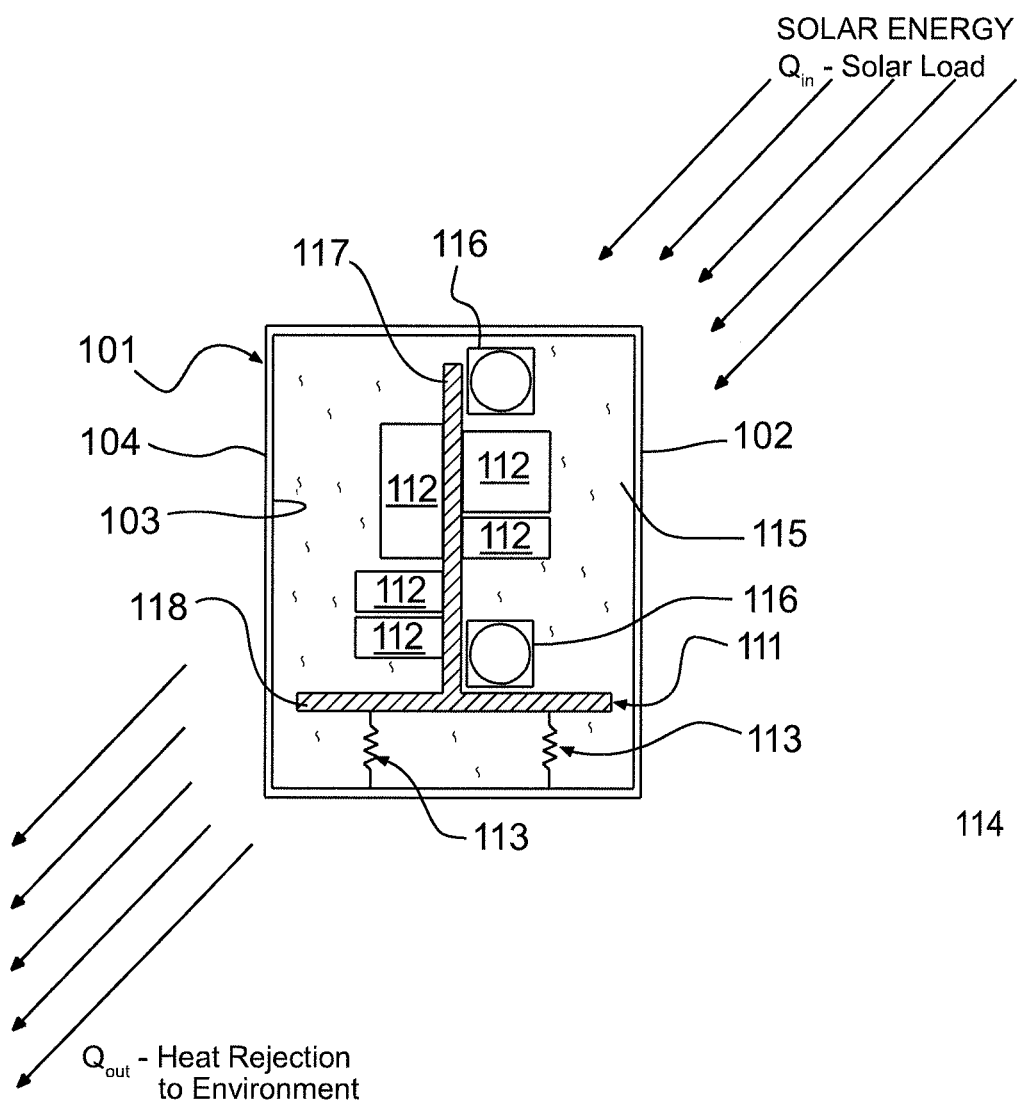
FIG. 3 is a section view of an embodiment of the invention depicting heat transfer.

With reference to FIG. 3, the heat exchange between the thermal working fluid 115 and components 112 occurs as the forced convection flow of the thermal working fluid 115 directs the thermal working fluid 115 past the internal components 112. Subsequently, the forced convection drives the thermal working fluid 115 along the interior faces 103 of the structural walls 102 of the pressurized structure 101, thereby providing heat transfer to the external surfaces 104 of the structural walls 102 and radiating heat energy (Q_out) to the surrounding environment 114. As a result, embodiments of the invention mitigate the problem of enabling heat transfer and thermal management of internal components 112 without the need for costly and heavy heat transfer systems. In certain embodiments, the thermal working fluid 115 comprises Nitrogen gas. Other embodiments may comprise a thermal working fluid or a plurality of thermal working fluids of gaseous or liquid form. Furthermore, embodiments may employ a plurality of circulating mechanisms 116, preferably at opposite ends of the internal mounting structure 111, to induce a forced convection flow around the internal pressurized volume of the pressurized structure 101. The energy output by the components 112 and ancillary support equipment within the pressurized structure 101 is demonstrated by the term Q_component.

The heat exchange rate associated with the forced convective flow of a thermal working fluid 115 can be modulated by controlling the flow rate of the thermal working fluid 115 past internal components 112. This modulation can occur automatically with predetermined computer controlled algorithms, which may be modified prior to deployment of the space vehicle, or throughout the lifecycle of the space vehicle, or actively controlled by personnel at a ground-station. The flow rate of the thermal working fluid 115 is controlled by adjusting one or more circulation devices 116. Flow rate provided by the circulation devices 116 can be modified by using a number of strategies including but not limited to, power modulation, bladepitch adjustment, armature diameter adjustment, and other methods appreciated by those skilled in the art.

In yet another embodiment of the invention, guiding flow features 108 (shown in FIG. 8) on the interior of the pressurized structure 101 provide directional guidance for the forced convection. Such guiding flow features 108 optimize the forced convection flow path within the pressurized structure 101 utilizing a thermal working fluid 115 and at least one circulation device 116. Guiding flow features 108 may comprise but are not limited to fin structures, channels, ducting, plenums, substantially conical forms, helical structures, and other forms appreciated by those skilled in the art to assist in fluid flow guidance of the thermal working fluid 115.

Although a zero-loss, hermetically, or perfectly sealed environment is preferred, operative environments sometimes prevent the achievement of such. In an embodiment of the invention, a supplement to the internal thermal working fluid 115 may be required to maintain an amount of thermal working fluid 115 to maintain pressure consistent with pre-deployment statistics. Such supplementary supply to the thermal working fluid 115 is typically provided from a component 112 comprising a pressurized container which may comprise of metal, composite, or other material appreciated by those skilled in the art to provide structure necessary to contain fluids, typically of the gaseous state, at an elevated pressure to reduce form factor. The pressurized container typically supplements thermal working fluid 115 at a pressure above that of the target pressure of the pressurized structure 101. Furthermore, the pressurized container may hold thermal working fluid 115 at a pressure many times that of the pressurized structure 101. In the event of pressure loss, typically signifying a loss of thermal working fluid 115, the supplementary thermal working fluid will release from the pressurized container until a pressure congruent with mission specifications is met.

In certain embodiments of the invention, the exterior surfaces 104 of a pressurized structure 101 are coated with a surface treatment such as paint, chemical coatings, mirrors, tapes and/or electroplating to adjust the emissivity of the exterior surfaces 104. In doing so, the passive heat absorptivity and rejection can be adjusted as desired by the requirements of the components and associated operational heat output. It will be appreciated by those skilled in the art that the effect of irradiance of solar radiation upon a surface, commonly referred to as Irradiance or Radiant Flux Density, is a function of effective surface area (Aeff) and absorptivity ($\alpha$). It will also be appreciated by those skilled in the art that absorptivity is a surface property in reference to the fraction of irradiation absorbed by a surface and is presented as a ratio between the values of 0.0-1.0. A surface exhibiting an absorptivity value of 0.0 does not absorb any, or perfectly reflects all, solar radiation energy which strikes it. A surface exhibiting an absorptivity value of 1.0 perfectly absorbs all solar radiation energy that strikes it.

Effective Surface Area, as used herein, refers to the maximum cross section of an object perpendicular to solar exposure (E_solar). Accordingly, the heat energy input (Q_in) can be calculated by the following function:

$$Q\_in = A_{\mathit{eff}} = \alpha = E\_solar \tag{1}$$

Thus, the heat energy absorbed by a given surface can be passively controlled through the surface treatment that changes the $\alpha$-value of a given surface. Therefore, given surfaces A_1 and A_2; if:

$$A\_eff2 = A\_eff1/n \tag{2}$$

Wherein n is a scaling factor;

$$Q\_in1 = Q\_in2 \tag{3}$$

if and only if, $$\alpha\_2 = (n \times \alpha\_1) \quad (3)$$

And it will be further appreciated that:

$$(A\_Eff2/A\_Eff1) = (\alpha\_1/\alpha\_2). \quad (4)$$

It will be appreciated that Emissivity is a surface property in reference to its effectiveness in emitting energy as thermal radiation and is demonstrated as a fraction between the values of 0-1.0. A surface exhibiting an Emissivity value (ε) of 0 does not emit any thermal energy. A surface exhibiting Emissivity value (ε) of 1.0 emits perfectly.

The amount of energy that is emitted to the surrounding environment by a given surface is provided by the following equation:

$$Q\_out \times A \times \sigma \epsilon \times T^4 \quad (5)$$

Wherein:
σ refers to the Stefan-Boltzmann constant: $5.670373=10^{-8}$ W/(m²·K⁴),
T refers to the temperature of the surface in Kelvin, and
A refers to the surface area in question, in this case the total exterior surface 104 of the pressurized structure 101. The area of the exterior surface 104 could be increased by the addition of radiator surfaces 129 (shown in FIG. 6) mounted to the exterior surface 104 of the pressurized structure 101. The radiator surfaces 129 may be mounted to the pressurized structure 101 in a folded configuration such that the radiator surfaces 129 can be selectively extended from the pressurized structure 101. The extra radiator surfaces 129 will impact energy in (Q_in) or out (Q_out) depending on the optical properties selected. For example, the application of black paint to the radiator surfaces 129 will bring more energy in, thereby increasing the operating temperature. In contrast, the application of a low absorptivity treatment to the radiator surfaces 129 will do the opposite. The extra surfaces 129 can be added to result in the desired effect. It will be appreciated by one skilled in the art that in order to reach energy equilibrium the following equation must be satisfied:

$$Q\_component + Q\_in = Q\_out \quad (6)$$

In embodiments of the invention, the Emissivity (ε) and Absorptivity (α) are adjusted to mission profiles to create thermal characteristics concurrent with desired mission profile. In this embodiment the surface Emissivity and Absorptivity are adjusted through the use of a surface applique or tape commonly used in the art. Such applique tapes include, but are not limited to, aluminized polyimide film and silver coated Teflon® tape. Therefore, the Emissivity (ε) and Absorptivity (α) are adjusted such that the equation (6) is satisfied.

Selection of appropriate α values for the external surfaces 104 of the pressurized structure 101, enables the satisfaction of Equation (4) and the maintenance of an equilibrated and constant Q_in. As the largest variable in the prior art regarding thermal management involves the variable solar radiation driven Q_in, this further supports the balance of Equation (6) and enables the maintenance of a constant temperature within the pressurized structure 101. A constant bulk temperature surrounding components 112 allows a simplistic thermal management model and solves the problem of needing costly or heavy thermal management systems. Furthermore, a plurality of system configurations may be equilibrated satisfying Equation (6) through selection of α-values, selectable through area ratios, thereby mitigating the costs associated with thermal management and mission redesign based on mission profile. This mitigation of costs allows the use of a singular platform for a plurality of mission profiles.

Figure 6:
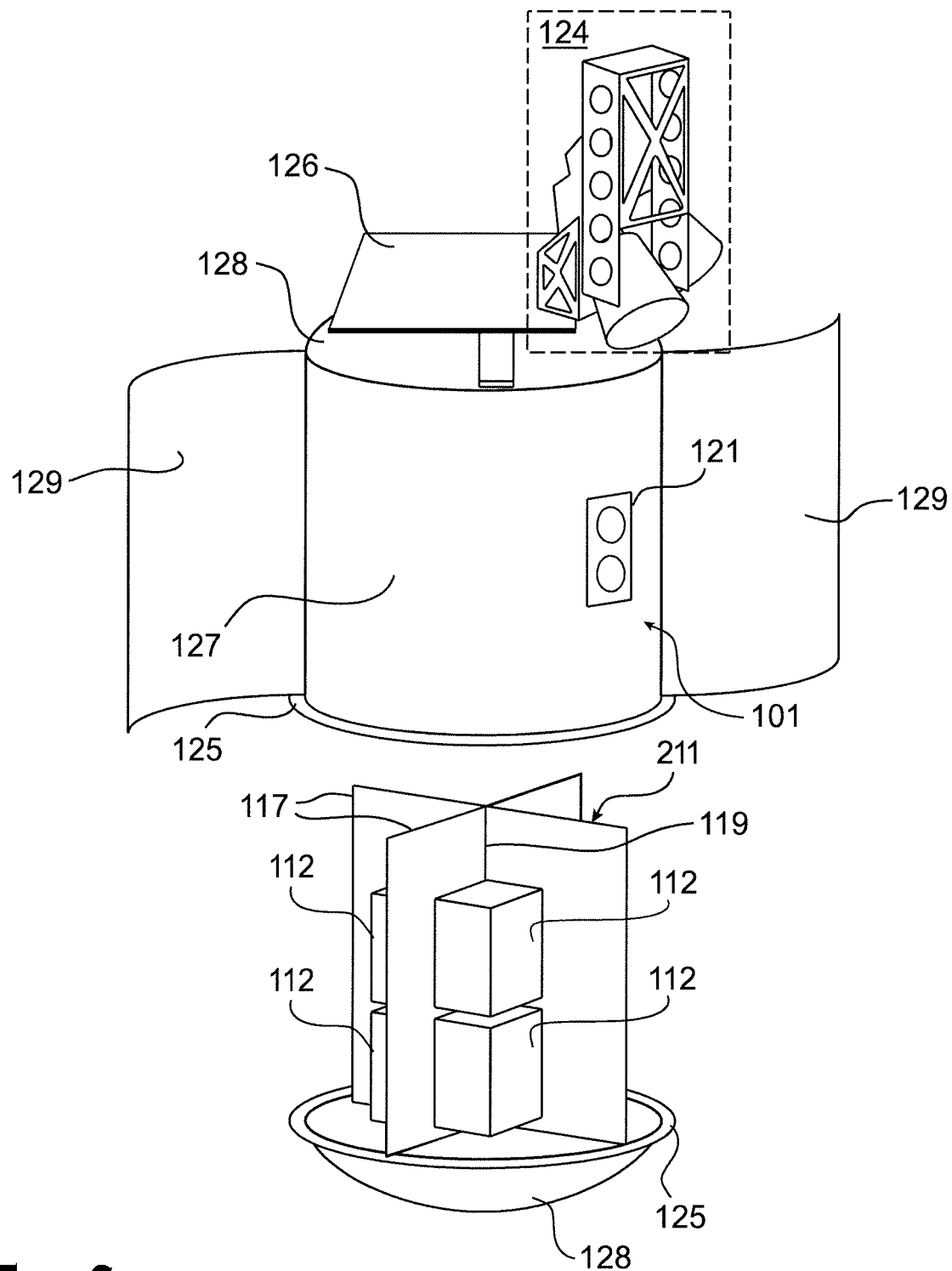
FIG. 6 is an exploded perspective view of an embodiment of the invention.

In certain embodiments of the present invention, the pressurized structure 101 associated with a space vehicle 100 comprises an assembly of a plurality of independent compartments. The pressurized structure 101 may be utilized alone or in combination with other pressurized structures 101 in variations of the certain embodiments. Such independent parts enable the assembly, disassembly, integration, and maintenance of the pressurized structure 101 and associated components mounted within. FIG. 6 exhibits a cylindrical form pressurized structure 101 with flanged features 125 enabling the attachment of a hemispherical end-cap at one distal end of the space vehicle 100 and bulkhead fittings 121 further enabling the pass-through of wires and the like through the pressurized structure 101 while maintaining pressure within the pressurized structure 101. Furthermore, this embodiment provides a bi-planar mounting structure allowing for the mounting of external payload components at the opposite distal end from the hemispherical end-cap.

The pressurized structure 101 in certain embodiments comprises a hollow cylindrical form 127 with an integrated hemispherical end-cap and separate hemispherical end-cap 128, as seen in FIG. 6. The mating interface between the independent parts may comprise of a singular or a plurality of attachment strategies known to those skilled in the art. In certain embodiments, the mating interface between the cylindrical form and hemispherical end-cap comprises a flanged assembly wherein each of the two portions exhibits a flanged feature 125 at their respective open ends. The flanged features 125 provide planar mating surfaces, typically planar and substantially parallel to adjoining flanged features. The flanged features 125 comprise a plurality of circular perforations radially around the flanged features 125. This enables the use of fastening hardware placed through the perforations and applying force to maintain a seal to prevent the loss of pressure.

In certain embodiments of the present invention, as seen in FIGS. 7A, 7B and 7C, the pressurized structure 101 exhibits an open cylindrical form with two hemispherical end-caps 128 affixed to the open cylindrical form using flanged features 125. Such embodiments permit the use of identical end-caps on both distal ends of the open cylindrical form and access to internal mounting structure 211, components 112, and internal access to connectors passing through a bulkhead fitting 121. Also seen in FIGS. 7A-C is circulation device 116 in certain embodiments of the invention.

In certain embodiments of the invention, an intermediate pressure-sealing layer, such as a gasket, separates the mating surfaces of two separate portions intended for augmentation of pressure sealing ability. Such gaskets typically comprise of sheet material cut to specific shapes to provide a higher-integrity sealing interface. Such gaskets may comprise of one or more materials including but not limited to materials polymeric, metallic, and/or organic in nature. Some examples of materials used in the manufacture of gaskets include but are not limited to asbestos, non-asbestos, rubber, ethylene propylene diene monomer (EPDM), nitrile, buna, neoprene, flexible graphite, silicone, metal, mica, felt or a plastic polymer such as polytetrafluoroethylene (PTFE), polyether ether ketone (PEEK), urethane, or ethylene propylene. It will be appreciated by those skilled in the art that an intermediate pressure-sealing layer or gasket may exhibit properties of compressibility to allow yielding and deformation thereby filling imperfections in mating surfaces, which may otherwise allow leakage of fluids. This enables cost reduction in the manufacture of mating surfaces as gaskets enable a lesser fidelity of tolerances in manufacturing of associated mating faces. Certain embodiments of the present invention incorporate a gasket in the form of what is commonly referred to as an O-ring.

Figure 9:
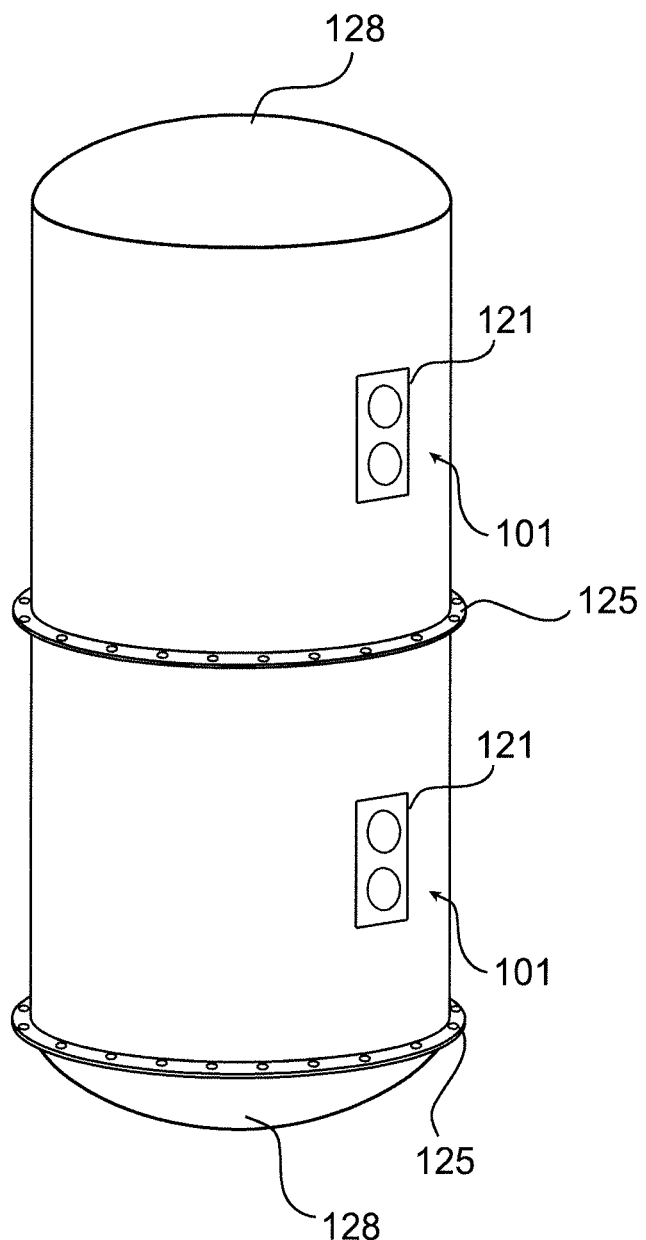
FIG. 9 is a perspective view of an embodiment of the invention.

In an embodiment of the present invention, the pressurized structure 101 includes an intermediate independent part providing increased internal space within the pressurized structure 101 as demonstrated in FIG. 9. Such an intermediate independent part, herein referred to as an "expansion part," incorporates open ends (similar to what is seen in FIG. 7B) to enable attachment to and integration with other parts comprising a pressurized structure 101, such as the hemispherical end-cap 128 and cylindrical part 127 with integrated hemispherical end-cap 128 of FIG. 6 simultaneously. In such an embodiment, the flanged features 125 of the expansion part matches those of the hemispherical end-cap 128 and cylindrical part 127 and affixes using means appreciated by one skilled in the art including, but not limited to, fastening hardware. In this embodiment, the expansion part comprises an open cylindrical faun 127 with a flanged feature 125 located at or near both distal ends enabling attachment to cylindrical part 127 with integrated hemispherical end-cap 128 and independent hemispherical end-cap 128. An expansion part allows the ability to increase additional payload and/or component space capacity without modification to the original space vehicle design. An expansion part provides identical mating interfaces matching adjacent independent parts. In the case of the aforementioned hollow cylindrical form 127 and hemispherical end-cap 128, the expansion part exhibits mating surfaces enabling assembly with the hollow cylindrical form 127 and hemispherical end-cap 128 without the need for modification of such entities. Furthermore, the expansion part comprising of a cylindrical form 127 further comprises of bulkhead fittings 121 providing increased capacity for pass-through of interface of internally mounted and externally mounted systems such as components and payload.

In yet another embodiment of the present invention, the exterior structure of the pressurized structure 101 incorporates external payload mounting surface 126 to enable the attachment of external payload(s) 124, as seen in FIG. 6. Such external payload mounting surface 126 may comprise a planar surface, a specialized mounting interface matching that of the components intended for external mounting, or any enabling mechanism appreciated by those skilled in the art.

In certain embodiments of the present invention as shown in FIG. 6, the associated pressurized structure 101 comprises a cylindrical vessel of two portions. A cylindrical portion 127 with integrated hemispherical end-cap and flanged feature 125 at the open end comprises one portion, and a hemispherical end-cap 128 with flanged feature 125 at its open end comprises a second portion. The pressurized structure 101 in this embodiment exhibits a cylindrical form of 60.96 cm (24-inch) diameter and 152.4 cm (60-inch) length. One skilled in the art will appreciate the scaling of these dimensions, dependently or independently, based on mission profile and associated payload configurations. Also provided is an internal mounting structure 211 comprised substantially of two mounting panels 117, which may be of planar form, meeting centrally at a post-like structure 119 at a central axis that extends along the vertical axis of the cylindrical portion 127 fastening radially proximate to the closed distal end of the cylindrical portion 127. The internal mounting structure 211 is constrained by a series of four mounting features 113 (shown in FIG. 5) providing thermal and mechanical isolation from the pressurized structure 101.

Figure 8:
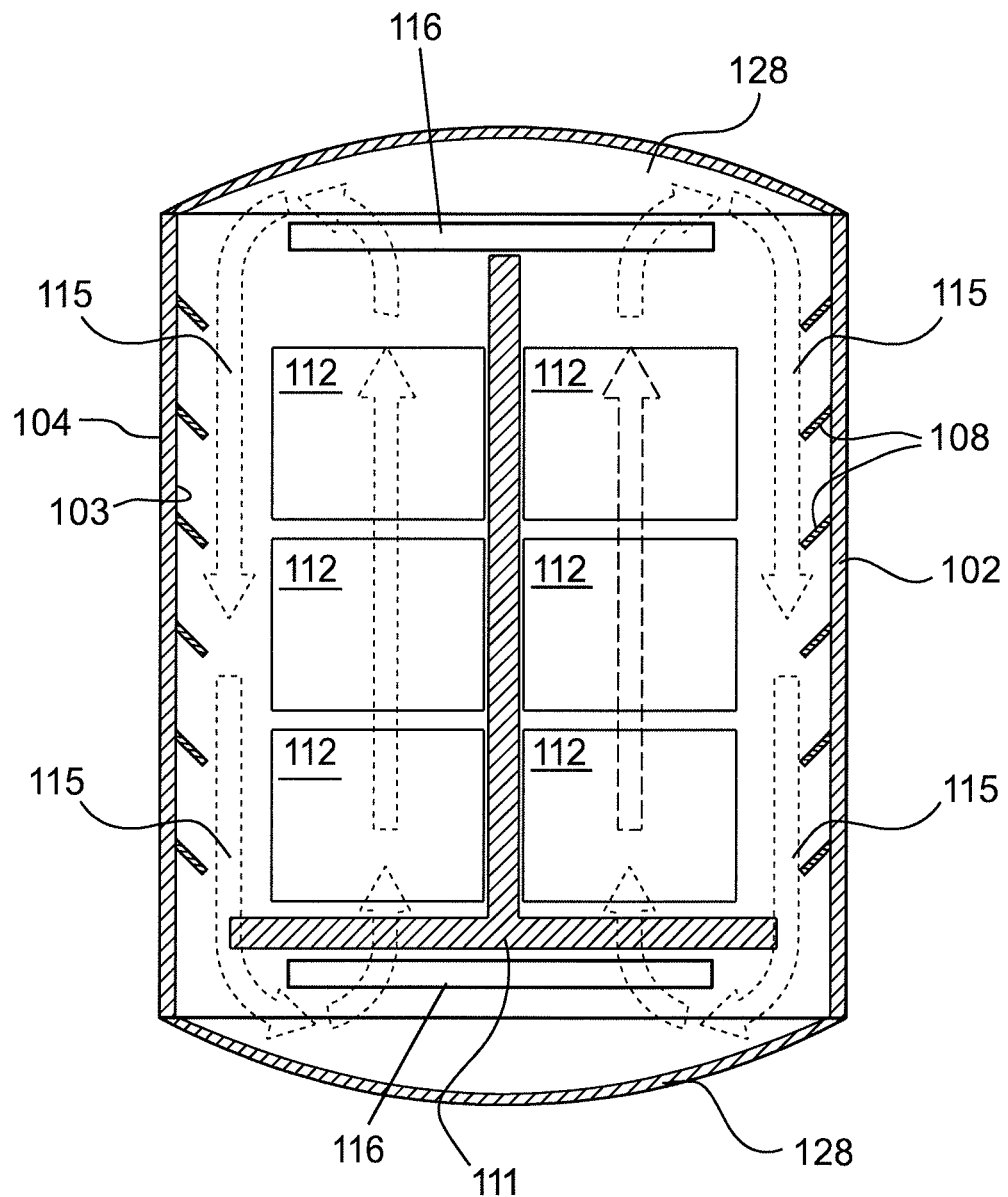
FIG. 8 is a section view of an embodiment of the invention.

Furthermore, as demonstrated in FIG. 8, certain embodiments utilize two circulation devices 116 to induce forced convection over the internal components 112 and across the interior surfaces 103 of the structural walls 102 of the pressure structure 101. The first circulation device 116 proximate to the base of the mounting structure 211 provides a high-velocity profile while the second circulation device 116 provides a high-pressure profile. Such configuration of circulation fans 116 provides for a cyclical forced induction such that thermal working fluid 115, typically cooler than internal components 112, passes over and absorbs thermal energy from the internal components 112. The thermal working fluid 115 then passes over the interior surfaces 103 of the structural walls 102 to create a thermal energy exchange between the thermal working fluid 115 and the internal surfaces 103 of the structural walls 102 of the pressurized structure 101. Structural walls 102 may also include guiding flow features 108 on the interior of the pressurized structure 101 to provide directional guidance for the forced convection. Furthermore, certain embodiments of the present invention provide for the pass-through of wires and support componentry to the payload 124 through the use of bulkhead fittings 121 which provide interface, typically electrical connections, through the pressurized structure 101 wall 102 without compromising the pressurized internal volume contained within the pressurized structure 101 as seen in FIG. 6.

The method of use of embodiments of the present invention provide mission agnostic integration of internal components 112 along the perimeter of the axial internal mounting structure 111 prior to mounting the hemispherical end 128 using the flanged features 125. Components 112 may also be mounted according to the configurations of internal mounting structures 211, 311 or other suitable configurations. Following mounting and integration, space vehicle 100 is deployed with a pressurized structure 101 encasing the internal components 112 and external payload 124. The space vehicle 100 may also include pressurization of the payload 124 by enclosing payload hardware and/or payload electronic components in a pressurized compartment, which may optionally be separate from the pressurized structure 101 of the spacecraft bus. The pressurized structure 101 in an embodiment of the present invention is pressurized to the equivalent of 1 Atmosphere or 14.7 psi. Further, in this embodiment, the thermal working fluid 115 comprises Nitrogen, and two circulation devices 116 drive forced convection within the pressurized compartment 101 to provide thermal management. Furthermore, according to this embodiment, energy Equation (6) is satisfied, providing thermal management equilibrium to the system through pre-launch calculation and adjustment of surface Emissivity and Absorptivity dependent upon mission profile. Where more than one circulation device 116 is provided, the first circulation device 116 drives the flow of the thermal working fluid 115 over the components 112, and the thermal working fluid 115 is passed over the components 112 inducing heat transfer between the components 112 and thermal working fluid 115. As increased temperature working fluid 115 moves proximate to the top of the mounting structure 111, 211 the second circulation device 116 drives the thermal working fluid 115 in line with the first circulation device 116 to provide a return flow. The return flow thus passes over the interior surface 103 of the structural walls 102 of the pressurized structure 101 to provide heat transfer away from the interior environment to the pressurized structure 101 of the space vehicle 100. Ultimately the heat is radiated to the external environment 114.

In certain embodiments, with reference to FIG. 6, a vertical mounting structure 211 comprised of a plurality of mounting panels 117 meeting at an intersection post structure 119, forming an intersection axis which is generally vertical axially, enables the attachment of components 112 within the pressurized structure 101. The internal mounting structure 211 comprises two intersecting panels 117 that may be planar wherein the intersection axis 119 is collinear to the central axis of the pressurized structure 101. Internally mounted components 112 may be affixed to the internal mounting structure 211 by use of attachment mechanisms and methods appreciated by those skilled in the art. In such an embodiment, the internal mounting structure 211 comprises a substantially post-like structure 119 constrained at both distal ends thereby employing two points of constraint or mounting features 113 preferably concentrically located within the body of the pressurized structure 101. In yet another embodiment, the post-like structure 119 of the internal mounting structure 211 is mounted coincident with the central vertical axis of the pressurized structure 101 and is constrained at one distal end by at least three points of constraint, preferably using mounting features 113.

According to an embodiment shown in FIGS. 10-15, internal mounting structure 311 is a tiered structure including a lower base panel 308, a base panel 318, and an upper base panel 328. The lower base panel 308 is mounted to the pressurized structure 101 by way of, for example, first mounting features 313 that may be similar to the previously described mounting features 113. Additional components, such as a battery 301 and torque rod 302 may be mounted on the lower base panel 308, with battery 301 being secured to the lower base panel 308 by second mounting features 323. Base panel 318 has a plurality of mounting panels 317 connected thereto, the mounting panels 317 including components 112. Base panel 318 could also include additional circulation devices 116 for cooling components 112 mounted on the mounting panels 317 through forced convection as previously described. The upper base panel 328 includes circulation devices 116 directing thermal fluid 115 throughout pressurized structure 101.

Figure 10:
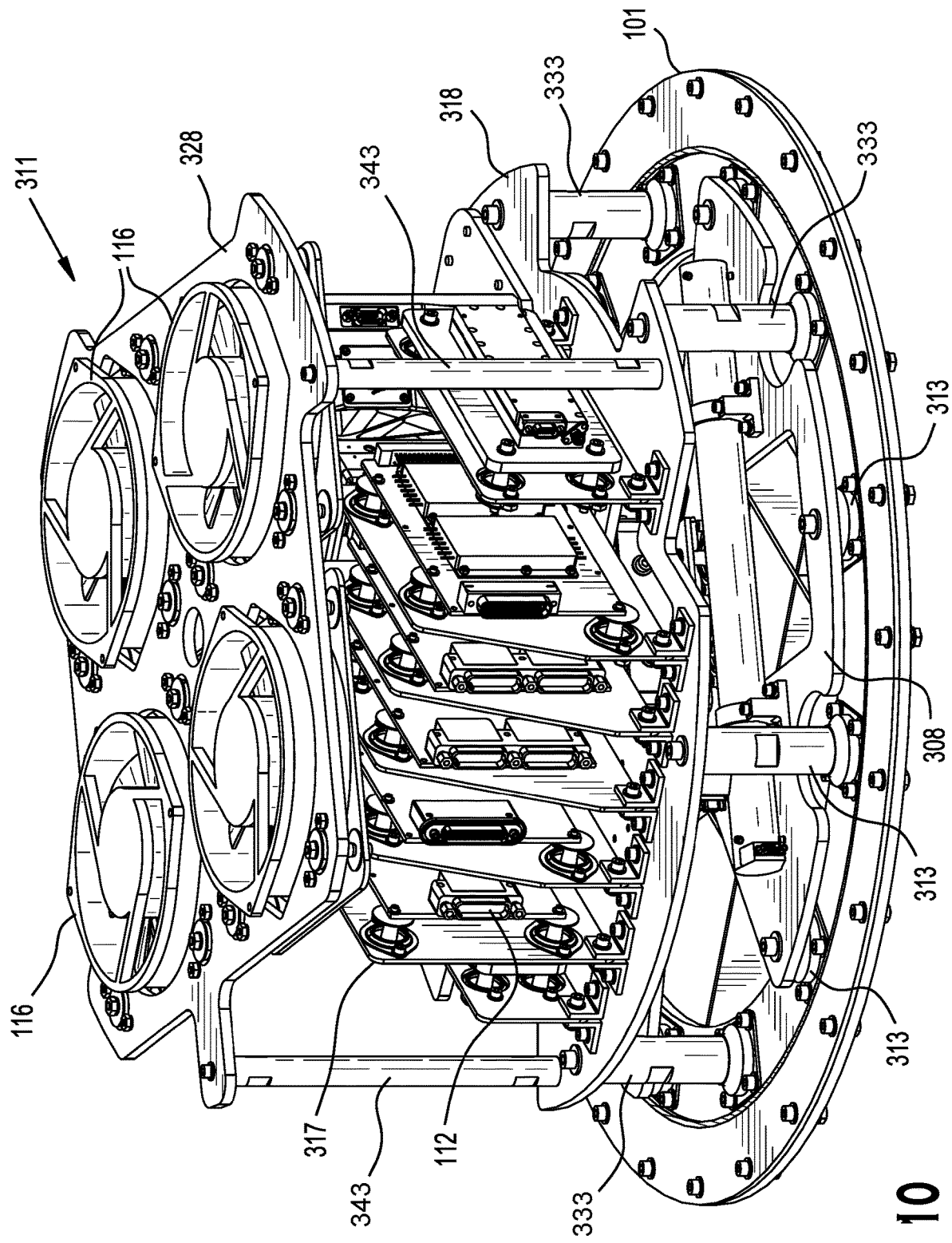
FIG. 10 is a perspective view of an internal mounting structure according to an embodiment of the invention.
Figure 11:
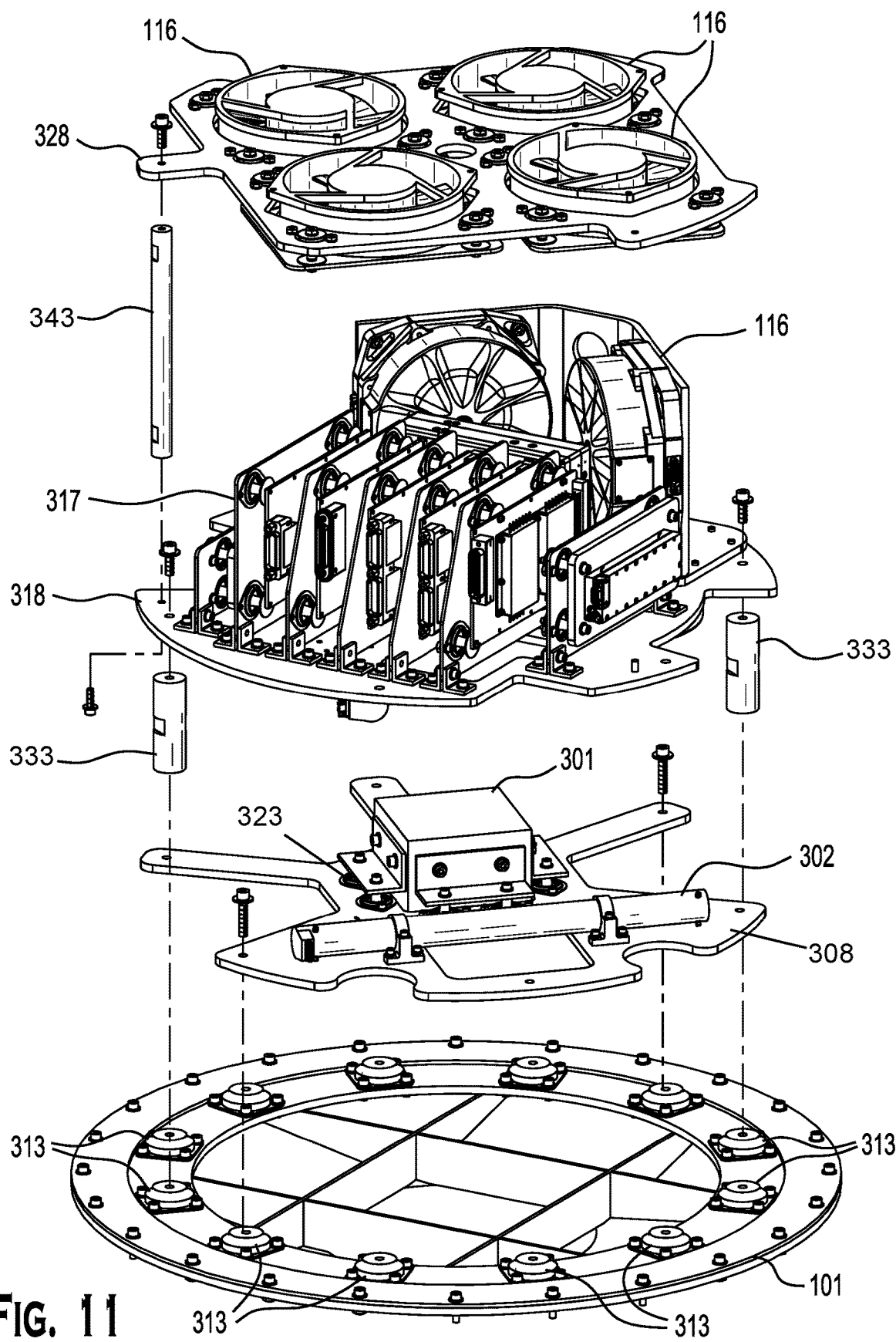
FIG. 11 is an exploded perspective view of the internal mounting structure shown in FIG. 10.
Figure 12:
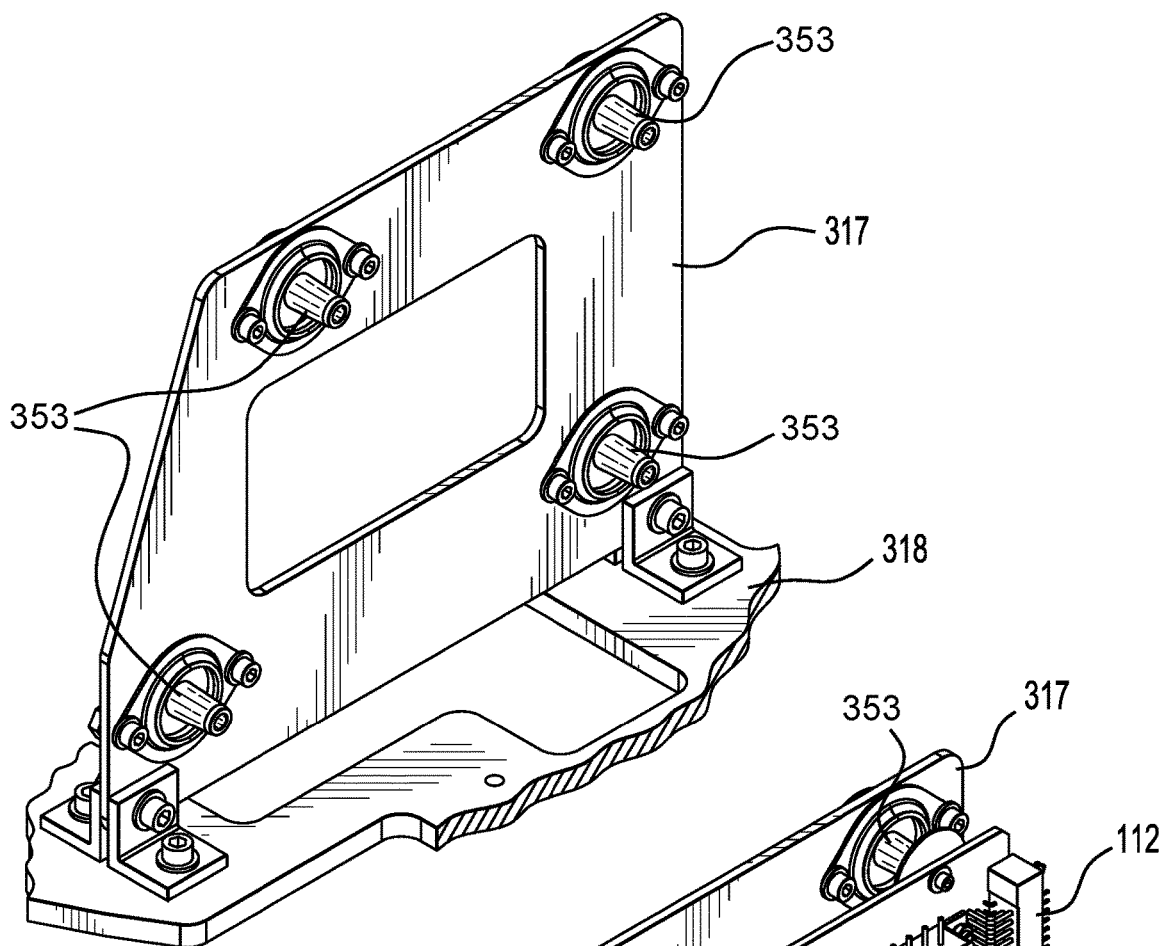
FIG. 12 is a detail perspective view of the internal mounting structure shown in FIG. 10.
Figure 13:
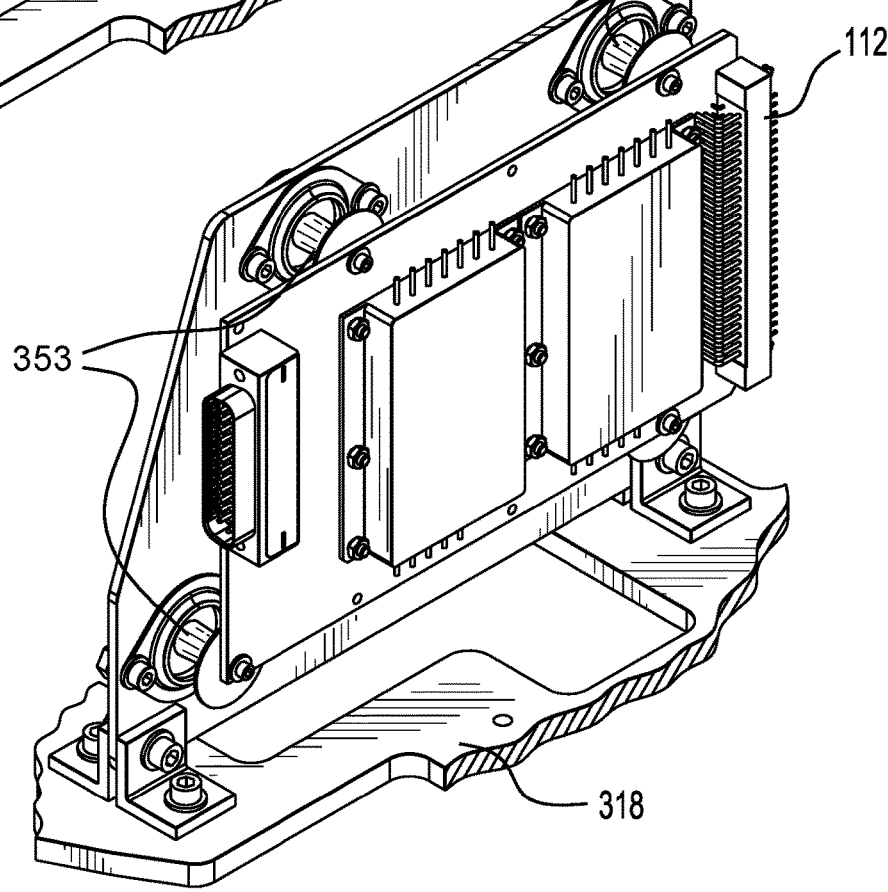
FIG. 13 is a detail perspective view of the internal mounting structure shown in FIG. 12 including a mounted component (e.g., a printed Circuit Board)
Figure 14:
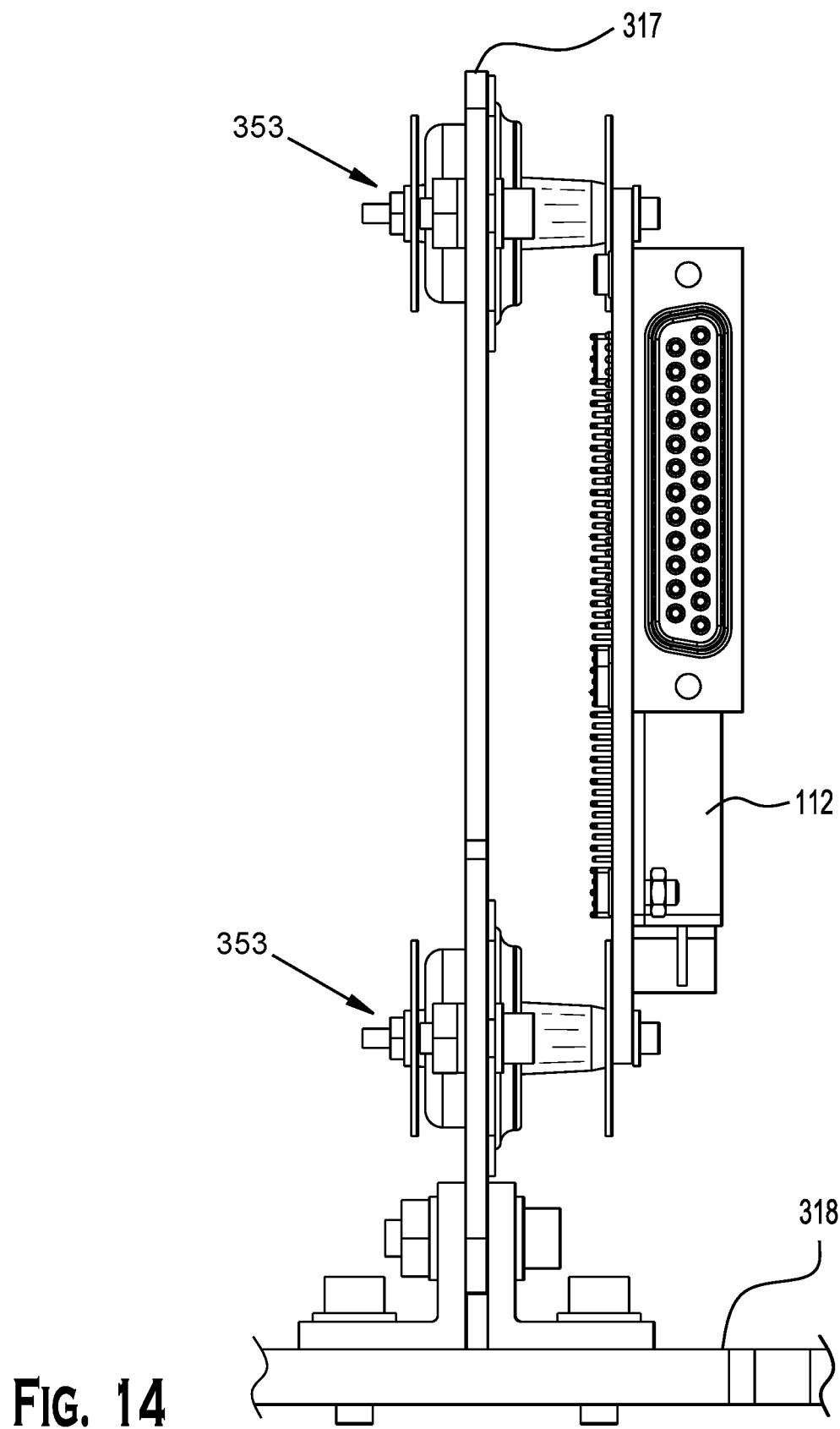
FIG. 14 is a front view of the internal mounting structure shown in FIG. 13.
Figure 15A:
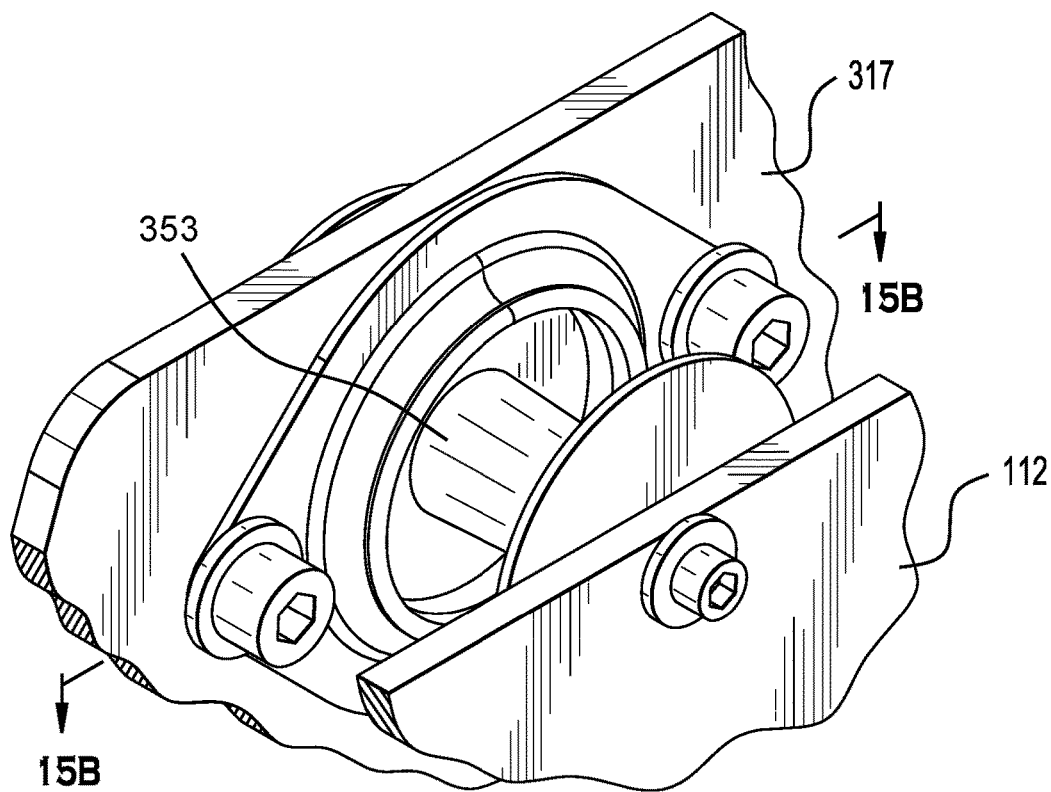
FIG. 15A is a detail perspective view of a mounting feature according to an embodiment.
Figure 15B:
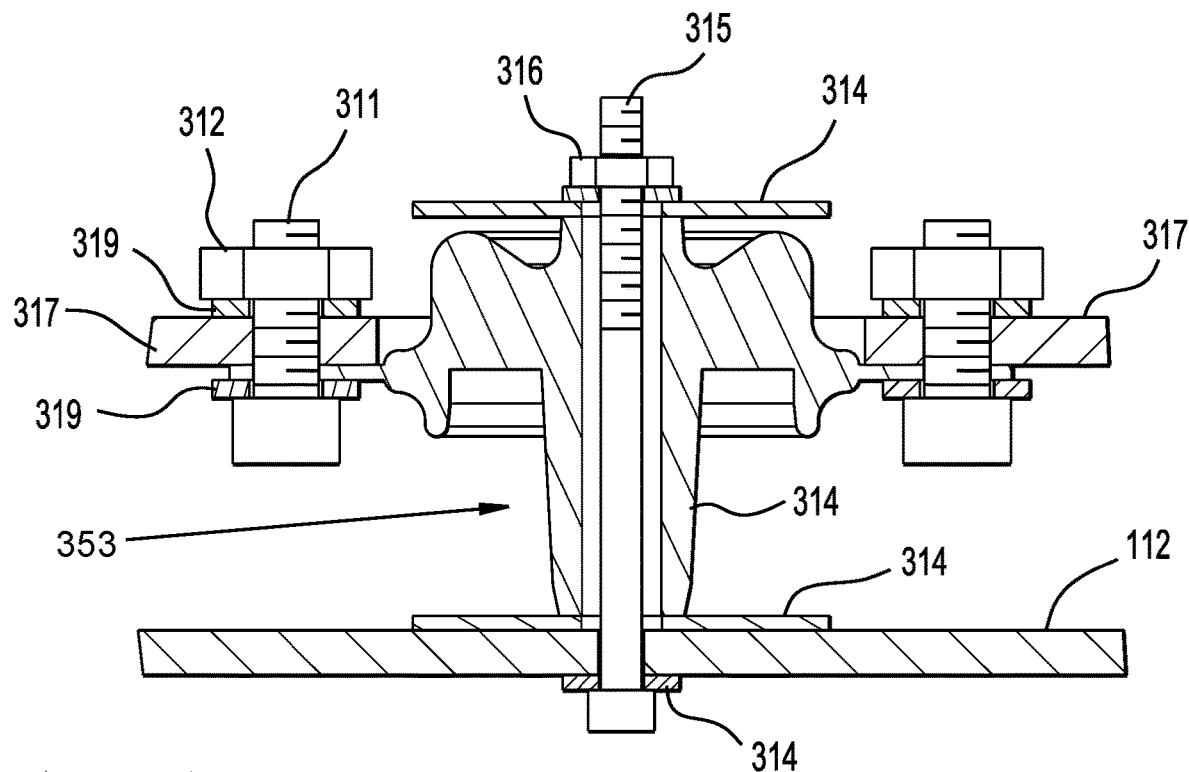
FIG. 15B is a cross-section view along line 15B-15B shown in FIG. 15A.

As shown in FIGS. 10 and 11, lower base panel 308 and base panel 318 are independently mounted to the pressurized structure 101 by way of separate mounting structures, lower base panel 308 being mounted by first mounting features 313 and base panel 318 being connected to first mounting features 313 by way of third mounting features 333. Upper base panel 328 is mounted to base panel 318 by way of fourth mounting features 343. Alternatively, each of lower base panel 308, base panel 318, and upper base panel 328 can be independently mounted to the pressurized structure 101 by way of separate mounting structures. Independently mounting the base panels 308, 318, 328 allows for increased isolation for each of the components in the pressurized structure 101. In the alternative, two or more of base panels 308, 318, 328 could be coupled together, or the base panels 308, 318, 328 could all be coupled together. The base panels 308, 318, 328 can be secured together by a variety of methods appreciated by those skilled in the art. The base panels 308, 318, 328 could also be secured together by mounting features, such as mounting features 113, that thermally and mechanically isolate the base panels 308, 318, 328 from each other. In each configuration, the internal mounting structure 311 assembly is isolated from the pressurized structure 101 by mounting features 313.

The various panels of internal mounting structures 111, 211, 311 can be comprised of aluminum utilizing lightening strategies appreciated by those skilled in the art. Such strategies may include but are not limited to drilling of holes, strategic cutting of material and integration of lighter material in non-load-bearing segments. In other embodiments, lighter weight materials appreciated by those skilled in the art may be used. Such lighter weight materials include but are not limited to aluminum foam, composite, plastics, and other lightweight composites such as honeycomb structural panels.

Attachment of internally mounted components 112 may be achieved by a variety of methods appreciated by those skilled in the art including, but not limited to, tapped holes, thru holes with threaded inserts affixed with epoxy, and a multitude of other potential mounting methods commonly dependent upon the supported load of the mounted component 112 and the characteristics of the internal mounting structure 111, 211, 311. Components 112 could also be mounted to the internal mounting structure 111, 211, 311 with mounting features 113, previously described, to further limit vibration and shock load transmitted to individual internally mounted components 112. For example, with reference to FIGS. 12-15, component 112 could be attached to mounting panel 317 with fifth mounting features 353 that thermally and mechanically isolate the components 112 from the mounting panels 317. Fifth mounting feature 353 can be attached to mounting panel 317 by way of bolts 311, nuts 312, and washers 319, or other suitable fastener structures. The fifth mounting feature 353 further includes a plurality of isolators 314, a bolt 315, and nut 316, for securing component 112 to the mounting panel 317. Isolators 314 are provided on both sides of mounting panel 317, on both sides of component 112, and between mounting panel 317 and component 112 to provide adequate thermal and mechanical isolation.

In certain embodiments, components 112 can be removed from their respective individual structures and the contained electronic cards, such as printed circuit boards (PCB) and the like, can be secured directly to the internal mounting structure 111, 211, 311 using apparatus and/or methods known to those skilled in the art. Such apparatus and methods include several existing electronic card attachment methods including, but not limited to, "Wedge-Loks®", through-hole bolted interfaces, and epoxy securing methods. This provides multiple benefits associated with cost, space, weight and thermal management as external enclosures associated with such circuit boards associated with components 112 increase the weight and volume required for internally held circuitry. Furthermore, the incorporation of such enclosures often requires additional testing and limits thermal management effectiveness.

Figure 16A:
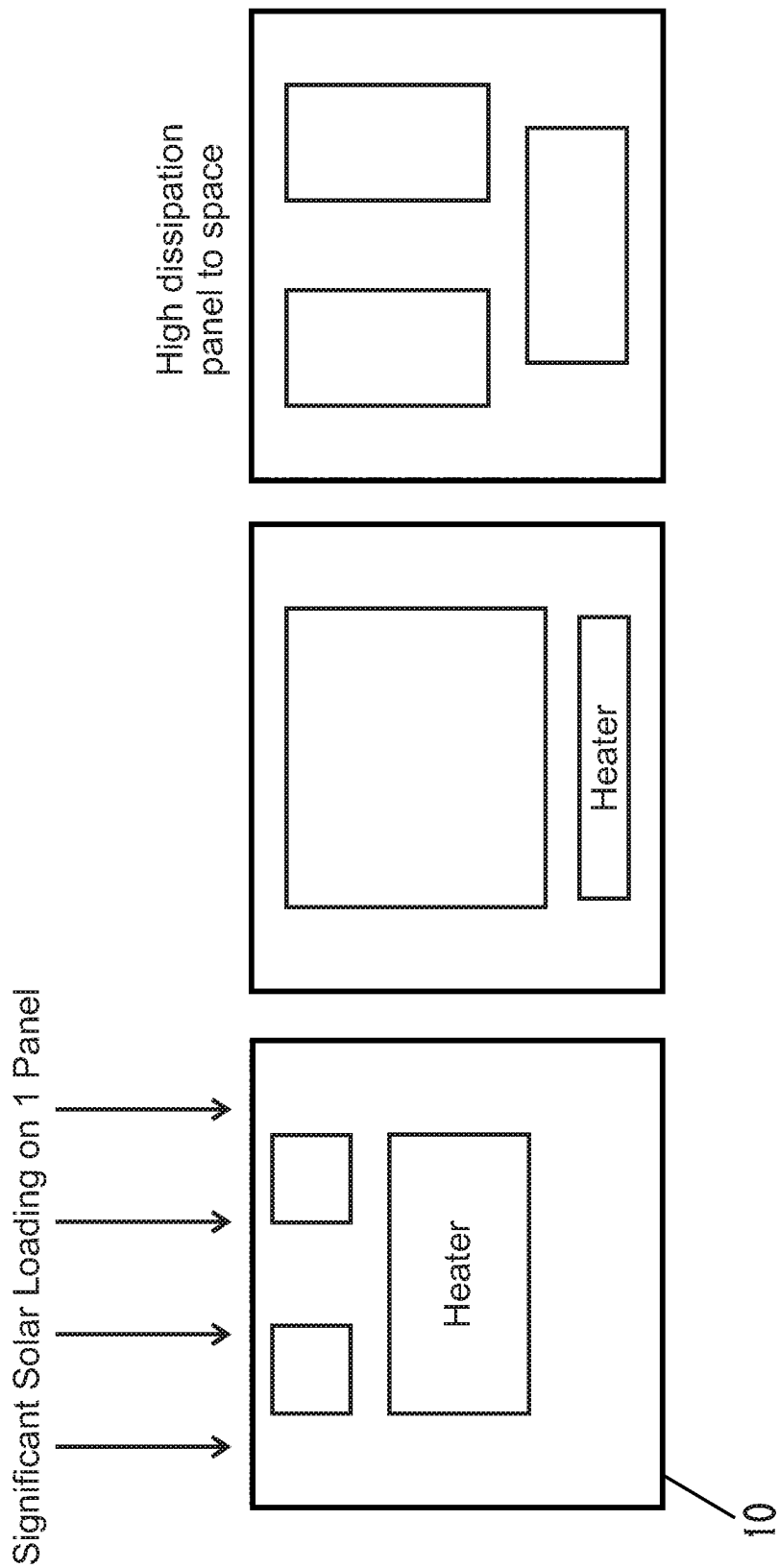
FIGS. 16A and 16B are representations of a conventional spacecraft design in different mission scenarios.
Figure 16B:
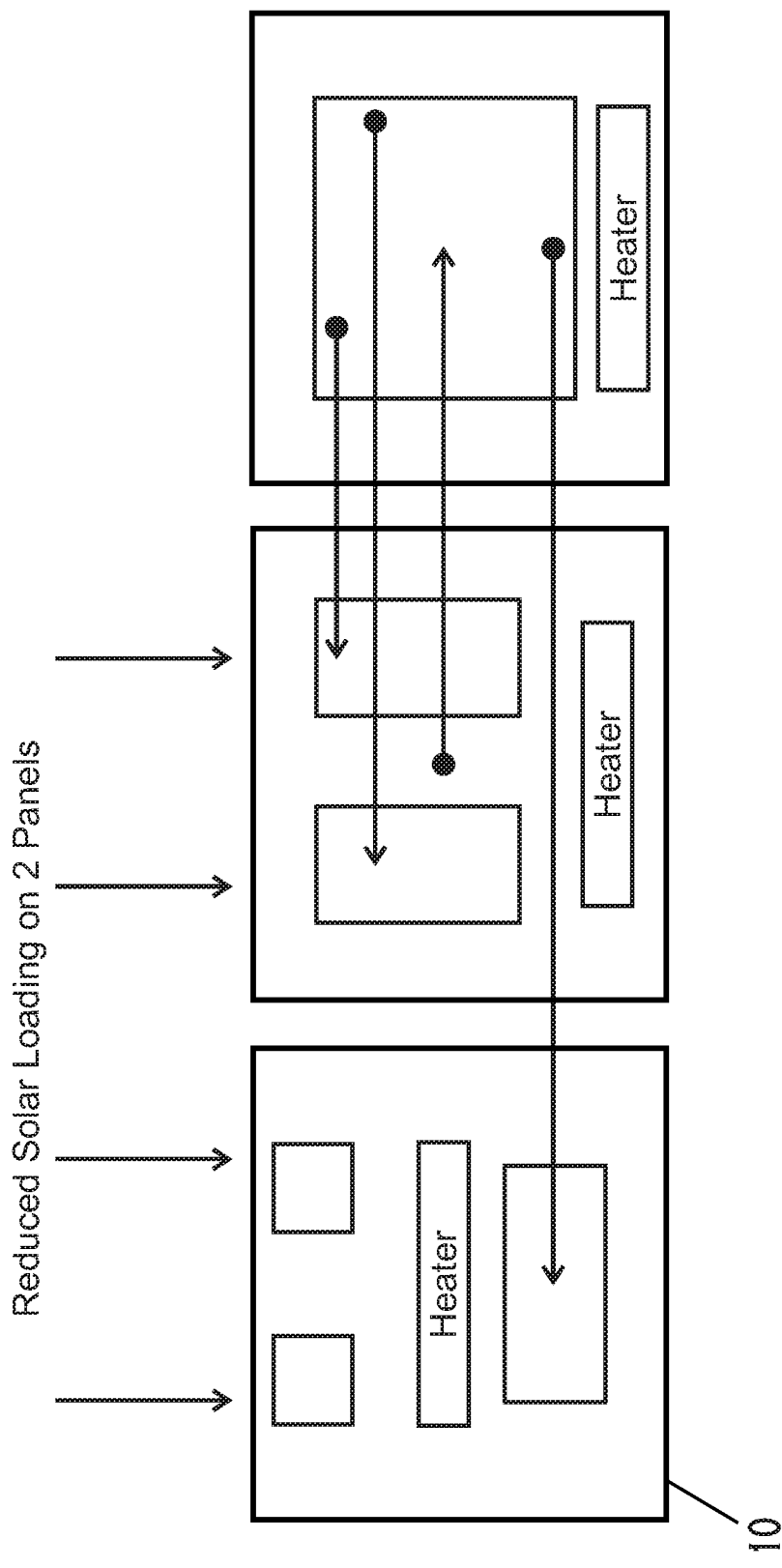

FIGS. 16A and 16B depict conventional vacuum designs according to two exemplary mission scenarios. The first scenario depicted in FIG. 16A shows a scenario in which the space vehicle 10 has significant solar loading on one panel of the space vehicle 10, and one panel of the vehicle 10 has high dissipation to space. The panel receiving the significant solar loading requires a large heater for a non-loaded condition. Components having a high dissipation are grouped on the face with high dissipation to space. A panel of the space vehicle 10 having intermediate dissipation includes the medium dissipation components, requiring a small heater for those components. Thus, according to the mission scenario depicted in FIG. 16A, a wide temperature variation is established in the space vehicle, thereby driving wide temperature requirements in the components and the design of the vehicle 10.

With reference to FIG. 16B, a scenario is depicted in which the solar loading is split between two faces, thereby requiring that components be reshuffled to more evenly distribute power dissipation relative to the scenario shown in FIG. 16A. In particular, a small or medium heater is required on all faces, and the established temperature ranges within the space vehicle differs from the scenario shown in FIG. 16A. Thus, optimization of the conventional space vehicle vacuum design requires a redesign of the system based upon the type of mission scenario encountered by the space vehicle.

Figure 17A:
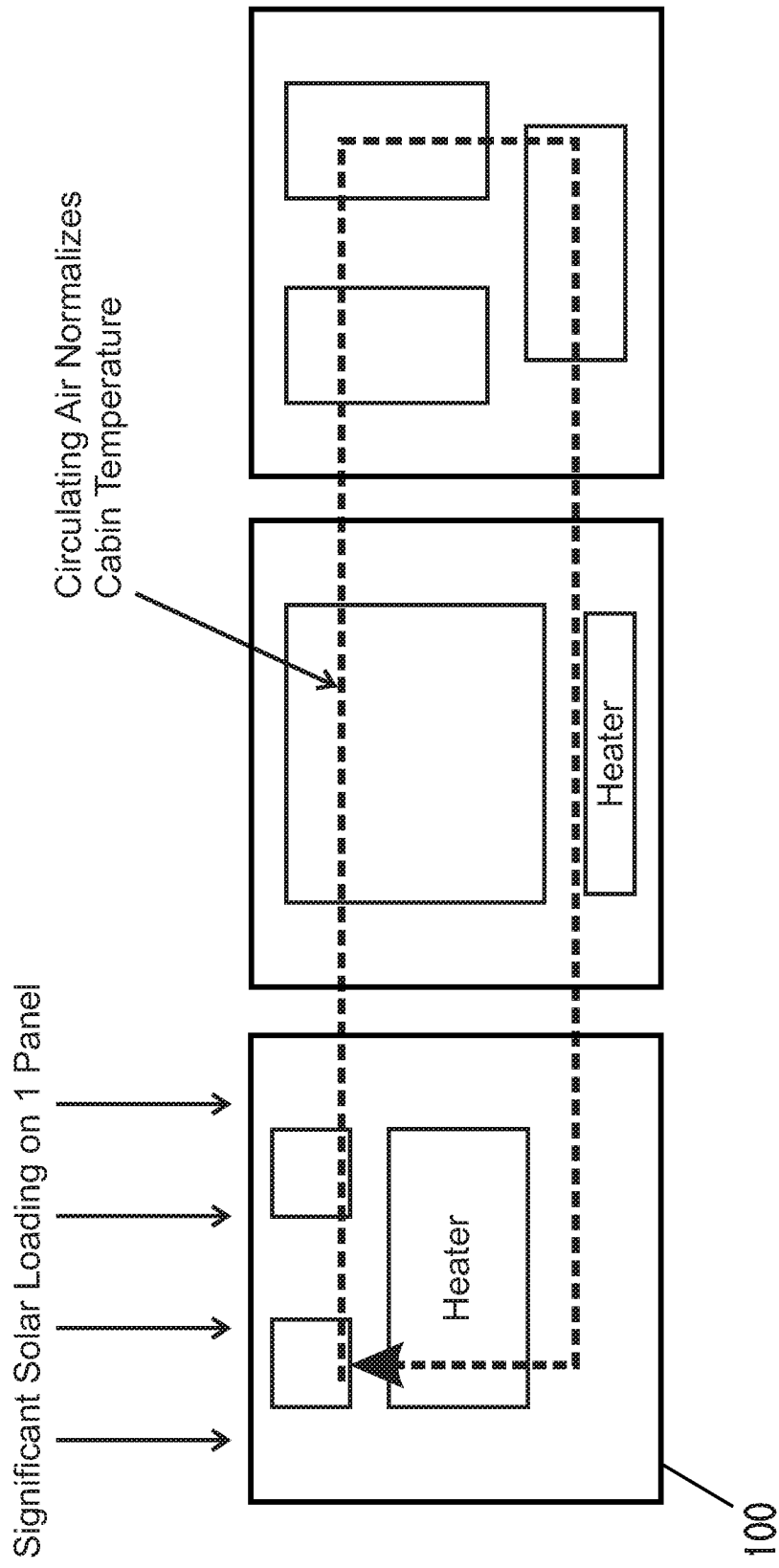
FIGS. 17A and 17B are representations of designs of different mission scenarios according to an embodiment of the invention.
Figure 17B:
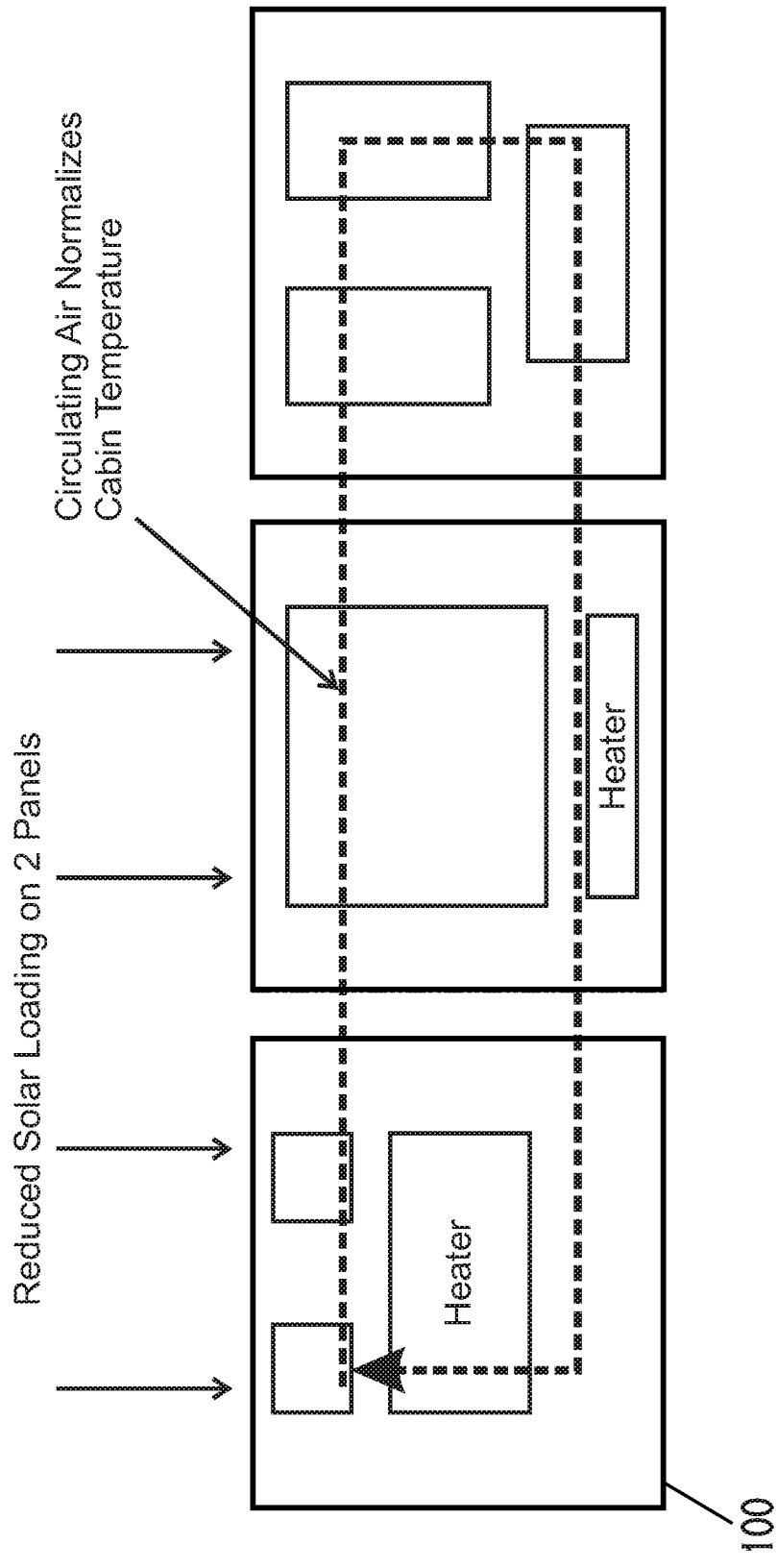

With reference to FIGS. 17A and 17B, optimization of the design of a space vehicle 100 according to an embodiment of the invention does not depend upon the mission scenario. As shown in FIG. 17A where a large solar load is applied to one face, circulating thermal fluid 115 (shown in FIG. 2) normalizes the temperature difference between the components. According to FIG. 17B, where the solar load is split between two faces, the circulating thermal fluid 115 (shown in FIG. 2) similarly normalizes the temperatures. Accordingly, embodiments of the present invention allow for the use of commercial components in the design of a space vehicle 100 and further allow for optimization of the design without regard to the mission scenario.

Figure 18:
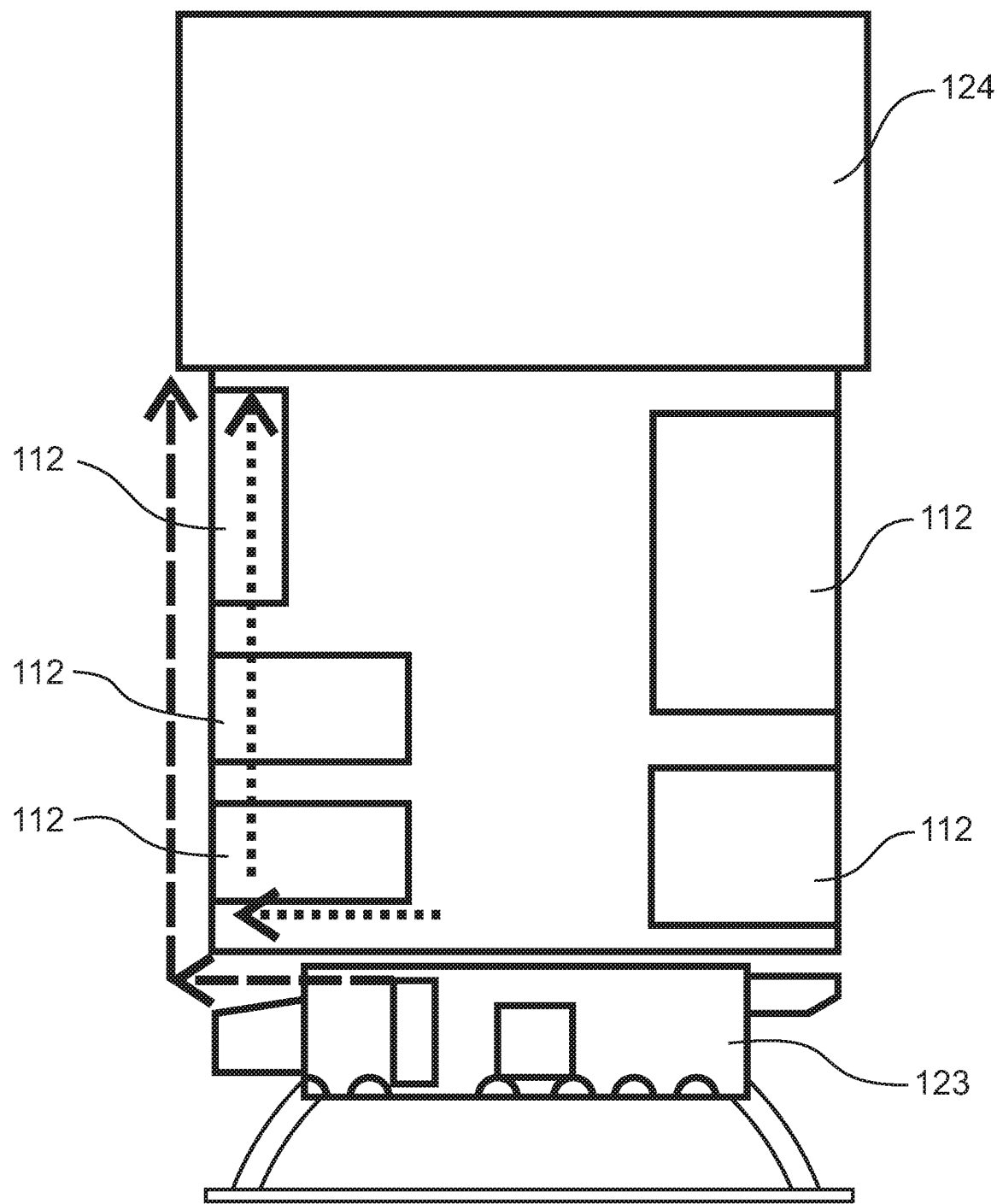
FIG. 18 is a diagram showing load paths in a conventional system.

FIG. 18 depicts the load path for the payload 124 as well as the bus according to a conventional design. Load from the launch load source 123 is transmitted to components 112 that are mounted to the structural walls of the space vehicle. The load is further transmitted to the payload 124 through the coupling between the bus and payload 124. Once the payload 124 is chosen for a specific mission, the particular load requirements for the chosen payload 124 will dictate the structural design of the bus.

Figure 19:
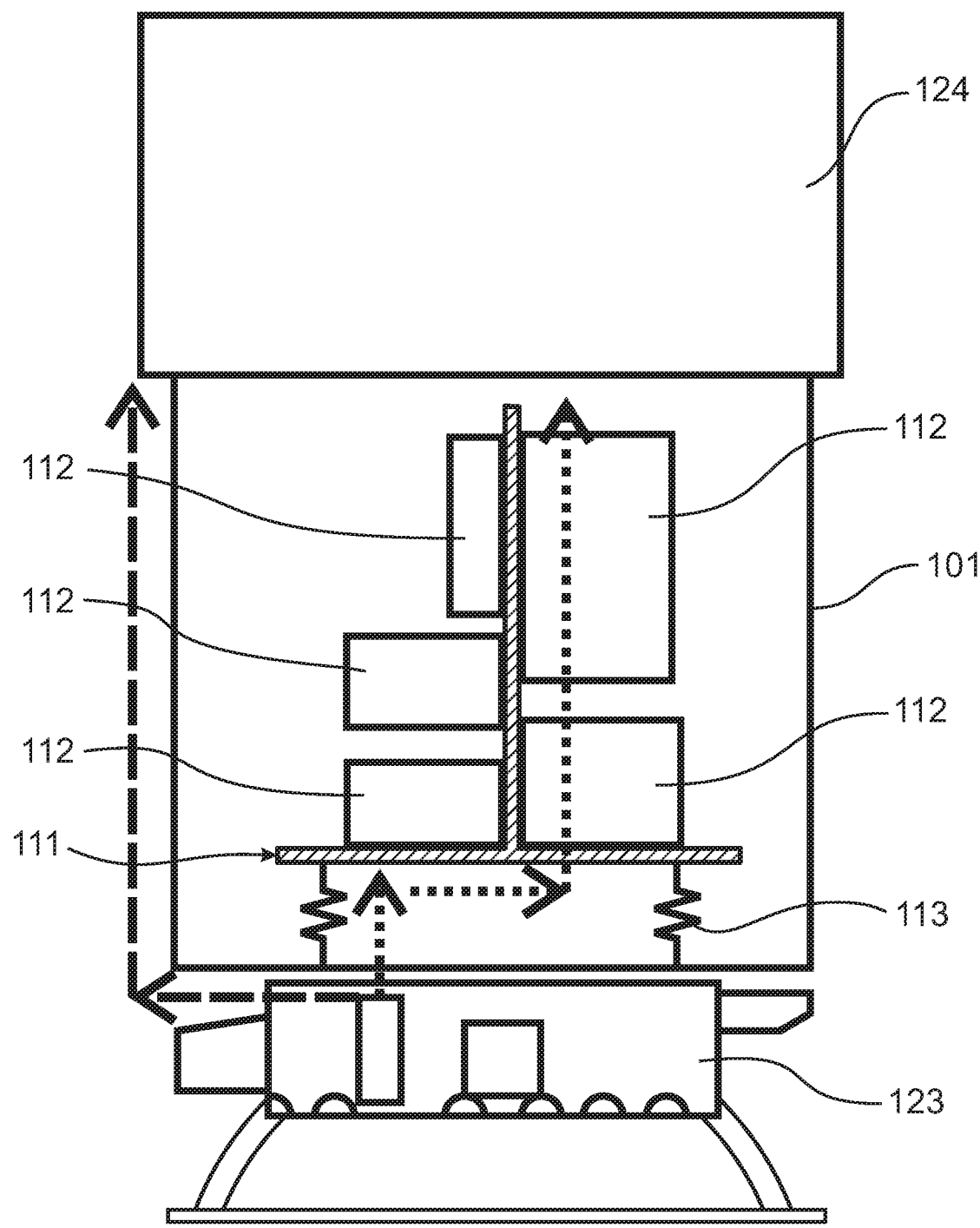
FIG. 19 is a diagram showing load paths in an embodiment of the invention.

FIG. 19 depicts the load path for the payload 124 as well as the bus 101 according to an embodiment. Mounting features 113 securing the internal mounting structure 111 to the pressurized structure 101 isolates the components 112 from the launch load. Thus, the structural design of the bus 101 according to an embodiment is not dependent upon the selection of a payload 124.

Figure 20A:
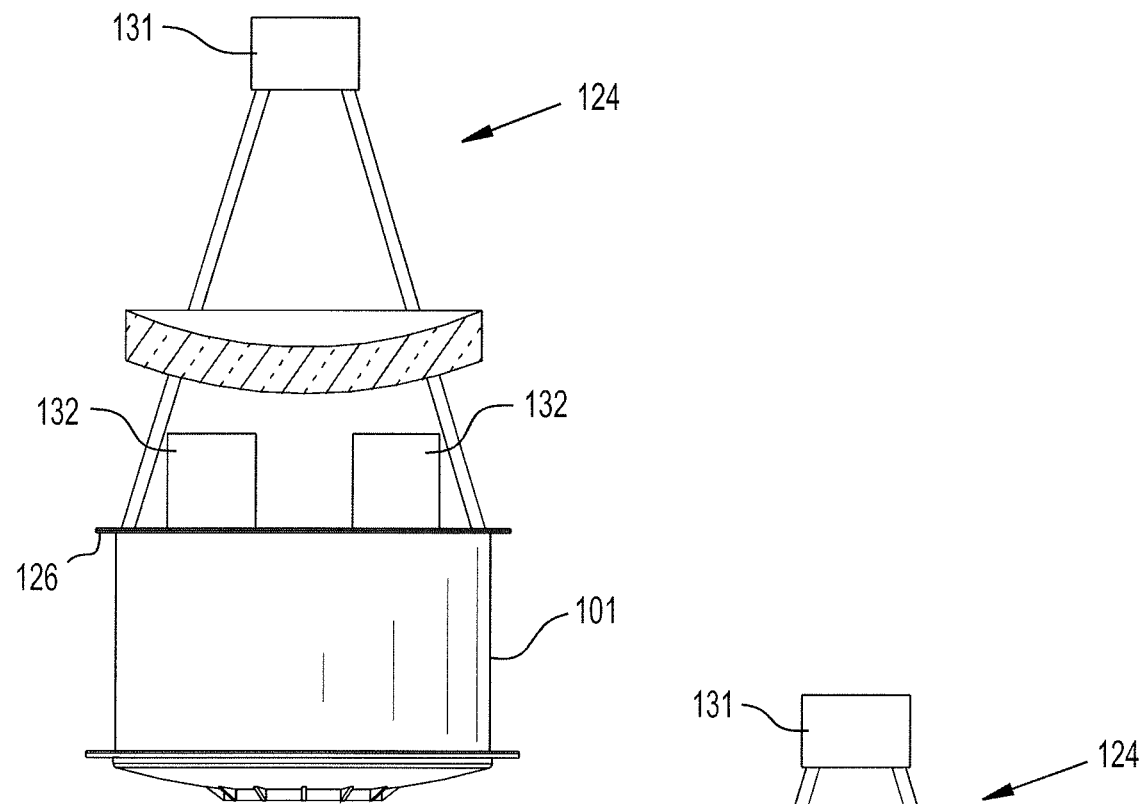
FIGS. 20A-20D show alternative payload configurations.
Figure 20B:
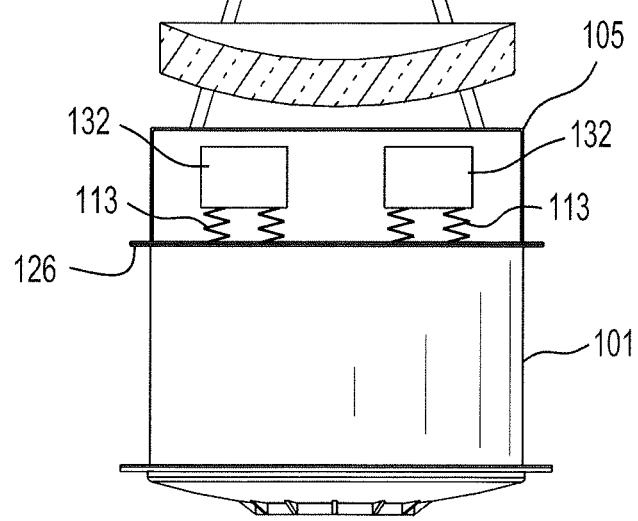
Figure 20C:
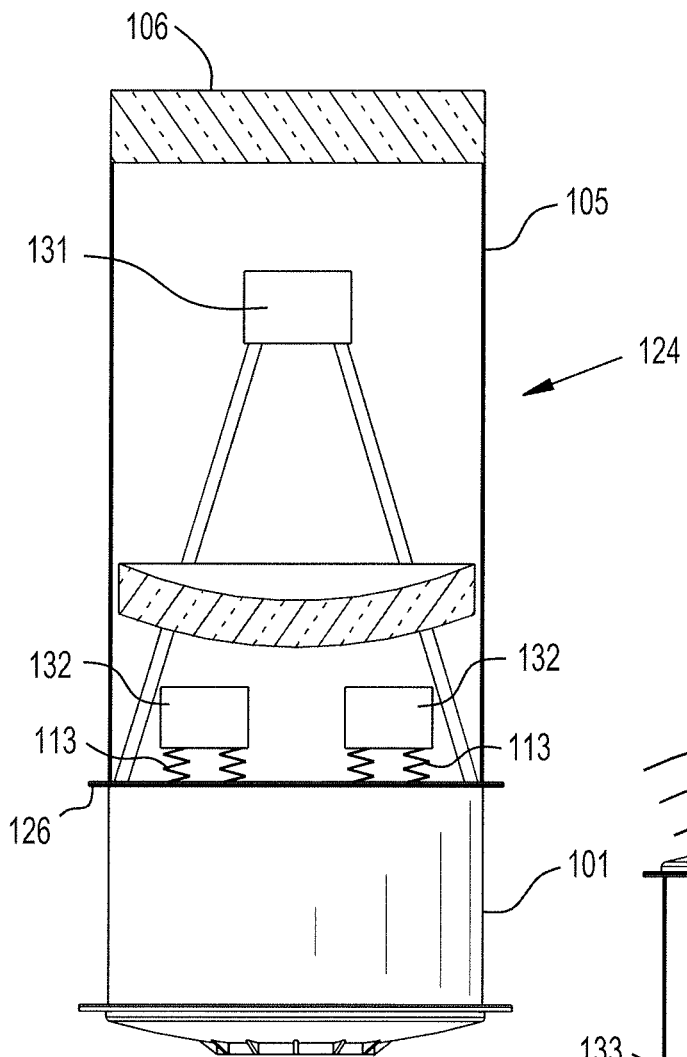
Figure 20D:
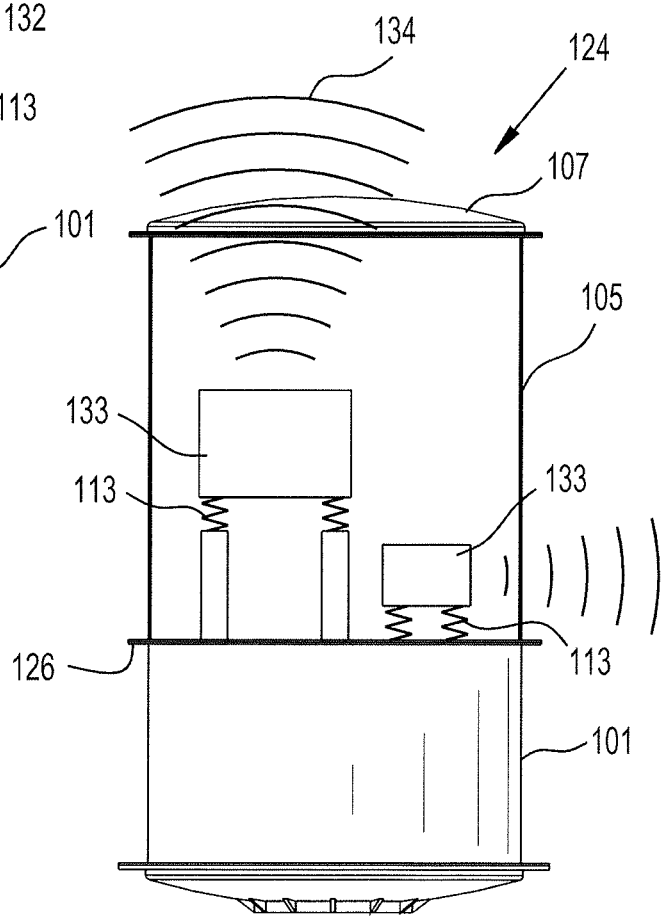

The application of the isolation principles according to embodiments to the payload 124 design could further simplify the design of the payload itself. For instance, with reference to FIGS. 20A-20D, the configuration of the payload 124 can assume various forms. As shown in FIG. 20A, payload 124 includes a device 131 (such as a camera) and electronics 132. The hardware of the payload, such as camera 131, and the associated electronics 132 can be electrically coupled in a variety of manners. For instance, the payload hardware 131 can be coupled directly to the electronics 132 by wired connections or can be electrically coupled wirelessly. The hardware 131 could also be electrically coupled to electronics 132 via connections with the bus 101 such that hardware 131 and electronics 132 are each individually coupled to the bus 101. Hardware 131 and electronics 132 are mounted to external mounting surface 126 of the pressurized structure 101 such that the hardware 131 and electronics 132 are not in a pressurized environment. In other words, the payload 124 is directly mounted to the pressurized structure 101. With reference to FIG. 20B, electronics 132 are provided within a payload pressurized structure 105, the electronics 132 being mounted to the external mounting surface 126 by mounting features 113. Hardware 131 is mounted to an external surface of the payload pressurized structure 105 such that the hardware 131 is not in a pressurized environment. With reference to FIG. 20C, the entire payload 124 including hardware 131 and electronics 132 are provided within the payload pressurized structure 105, and electronics 132 are mounted to the external mounting surface 126 by mounting features 113. A top surface 106 of the payload pressurized structure 105 may be made of a transparent material such as glass based upon the type of payload. In the example where a camera 131 is used, a transparent top surface 106 is required. With reference to FIG. 20D in which the payload 124 is an electronic signature payload 133, the payload pressurized structure 105 may be comprised of an electro-magnetic interference (EMI) transparent shell 107 to allow electro-magnetic radiation 134 to pass therethrough.

The preceding description has been presented with reference to various embodiments. Persons skilled in the art and technology to which this application pertains will appreciate that alterations and changes in the described structures and methods of operation can be practiced without meaningfully departing from the principle, spirit and scope.

The present systems, methods, means, and enablement are not limited to the particular systems, and methodologies described, as there can be multiple possible embodiments that may not be expressly illustrated in the present disclosures. It is also to be understood that the terminology used in the description is for the purpose of describing the particular versions or embodiments only, and is not intended to limit the scope of the present application.

Some embodiments, illustrating its features, will now be discussed in detail. The words "comprising," "having," "containing," and "including," and other forms thereof, are intended to be equivalent in meaning and be open ended in that an item or items following any one of these words is not meant to be an exhaustive listing of such item or items, or meant to be limited to only the listed item or items. It must also be noted that as used herein and in the appended claims, the singular forms "a," "an," and "the" include plural references unless the context clearly dictates otherwise. Although any methods, and systems similar or equivalent to those described herein can be used in the practice or testing of embodiments, the preferred methods, and systems are now described. The disclosed embodiments are merely exemplary.

While the invention has been disclosed with reference to certain preferred embodiments, numerous modifications, alterations, and changes to the described embodiments are possible without departing from the sphere and scope of the invention, as defined in the appended claims and their equivalents thereof. Accordingly, it is intended that the invention not be limited to the described embodiments, but that it have the full scope defined by the language of the following claims.

What is claimed is:

1. A payload compartment for a space vehicle, comprising:
   a pressurized structure having a structural wall, the structural wall having interior surfaces facing an interior of the payload compartment and exterior surfaces exposed to an external environment of space;
   a payload electronic component provided within the payload compartment; and
   mounting features supporting the payload electronic component from the pressurized structure,
   wherein the payload electronic component is spaced away from the interior surfaces of the pressurized structure, wherein the pressurized structure is filled with a thermal fluid, the thermal fluid enabling convective heat transfer between the payload electronic component and the interior surfaces of the pressurized structure, and wherein the exterior surfaces of the structural wall are configured to exchange heat with the vacuum of space via radiation heat transfer.

2. The payload compartment of claim 1, further comprising:
a payload hardware provided outside the pressurized structure, the payload hardware communicatively coupled to the payload electronic component.

3. The payload compartment of claim 1, further comprising:
a payload hardware provided within the pressurized structure, the payload hardware communicatively coupled to the payload electronic component.

4. The payload compartment of claim 1, further comprising:
a circulation device adapted to circulate the thermal fluid within the pressurized structure.

5. The payload compartment of claim 1, further comprising:
a supply container containing pressurized thermal fluid, wherein the supply container is adapted to supplement the thermal fluid in the pressurized structure to maintain a predetermined internal pressure of the pressurized structure.

6. The payload compartment of claim 1, further comprising:
an internal mounting structure for mounting the payload electronic component within the payload compartment, wherein the mounting features are adapted to thermally isolate the internal mounting structure from the interior surfaces of the pressurized structure and isolate the internal mounting structure from loads associated with launch.

7. The payload compartment of claim 6, wherein the internal mounting structure comprises:
a first mounting panel on which the payload electronic component is mounted.

8. The payload compartment of claim 6, wherein the internal mounting structure comprises:
a base panel connected to the structural wall of the pressurized structure, and
a plurality of mounting panels for mounting the payload electronic component, the plurality of mounting panels removably coupled to the base panel.

9. The payload compartment of claim 8, wherein the internal mounting structure further comprises:
a lower base panel for mounting a second payload electronic component, the lower base panel is being mounted between the base panel and the pressurized structure.

10. The payload compartment of claim 9, wherein the base panel is mounted to the pressurized structure independently from how the lower base panel is mounted to the pressurized structure.

11. The payload compartment of claim 9, wherein the base panel is coupled to the lower base panel.

12. The payload compartment of claim 1, further comprising:
a surface coating provided on the exterior surfaces of the pressurized structure, the surface coating being adapted to vary emissivity and absorptivity of the exterior surfaces.

13. The payload compartment of claim 12, further comprising:
radiator surfaces mounted to the exterior surfaces of the pressurized structure to expand a radiator surface area and/or vary emissivity and absorptivity area ratio properties to achieve desired internal operating temperatures in the pressurized structure.

14. The payload compartment of claim 1, wherein the pressurized structure comprises:
a first structural body; and
a second structural body coupled to the first structural body.

15. The payload compartment of claim 14, wherein the first structural body and the second structural body have a cylindrical shape.

16. The payload compartment of claim 14, wherein
the first structural body comprises a first flange on an open end of the first structural body, and
the second structural body comprises a second flange on an open end of the second structural body, the second flange adapted to be coupled to the first flange to form a seal between the first structural body and the second structural body.

17. A pressurized space vehicle, comprising:
a pressurized spacecraft bus for enclosing bus components required for a mission; and
a pressurized payload compartment connected to the spacecraft bus,
wherein the pressurized spacecraft bus comprises:
a first pressurized structure having a first structural wall;
a first internal mounting structure for mounting the bus components within the first pressurized structure; and
first mounting features supporting the first internal mounting structure from the first pressurized structure,
wherein the pressurized payload compartment comprises:
a second pressurized structure having a second structural wall;
a payload electronic component provided within the second pressurized structure, the payload electronic component spaced away from the second pressurized structure; and
second mounting features supporting the payload electronic component from the second pressurized structure,
wherein the first pressurized structure is filled with a first thermal fluid and the second pressurized structure is filled with a second thermal fluid, the first thermal fluid enabling convective heat transfer between the bus components and the first pressurized structure, the second thermal fluid enabling convective heat transfer between the payload electronic component and the second pressurized structure, and
wherein exterior surfaces of the first pressurized structure and exterior surfaces of the second pressurized structure are configured to exchange heat through radiation heat transfer with an external environment of space.

* * * * *